United States Patent
Yahiro et al.

(10) Patent No.: US 6,204,509 B1
(45) Date of Patent: Mar. 20, 2001

(54) PROJECTION-MICROLITHOGRAPHY APPARATUS, MASKS, AND RELATED METHODS INCORPORATING RETICLE-DISTORTION MEASUREMENT AND CORRECTION

(75) Inventors: Takehisa Yahiro; Noriyuki Hirayanagi, both of Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/191,466

(22) Filed: Nov. 12, 1998

(30) Foreign Application Priority Data

Nov. 11, 1997 (JP) .................................................. 9-308319

(51) Int. Cl.[7] .......................... H01J 37/304; H01J 37/153
(52) U.S. Cl. ...................................... 250/491.1; 250/492.2; 250/292.22; 250/397; 250/398
(58) Field of Search .............................. 250/491.1, 492.2, 250/492.22, 397, 398

(56) References Cited

U.S. PATENT DOCUMENTS

| | | | |
|---|---|---|---|
| 4,780,617 | 10/1988 | Umatate et al. | 250/548 |
| 4,962,318 | 10/1990 | Nishi | 250/548 |
| 5,115,456 | 5/1992 | Kimura et al. | 378/35 |
| 5,260,151 | 11/1993 | Berger et al. | 430/5 |
| 5,393,988 | 2/1995 | Sakamoto | 250/492.22 |
| 5,396,335 | 3/1995 | Hasegawa et al. | 356/401 |
| 5,422,491 | * 6/1995 | Sakamoto | 250/492.22 |
| 5,570,405 | 10/1996 | Chan et al. | 378/35 |
| 6,027,841 | * 2/2000 | Suzuki | 430/30 |
| 6,040,095 | * 3/2000 | Enichen et al. | 430/5 |
| 6,072,184 | * 6/2000 | Okino et al. | 250/492.2 |

FOREIGN PATENT DOCUMENTS

| | | |
|---|---|---|
| 61-44429 | 3/1986 | (JP) . |
| 62-291133 | 12/1987 | (JP) . |
| 3-153015 | 7/1991 | (JP) . |
| 5-160012 | 6/1993 | (JP) . |
| 10020481 | 1/1998 | (JP) . |

OTHER PUBLICATIONS

Behringer et al., "Repair Techniques for Silicon Transmission Masks Used for Submicron Lithography," *J. Vac. Sci. Technol.* 4:94–99 (1986).

Bohlen et al., "Electron–Beam Proximity Printing—A New High–Speed Lithography Method for Submicron Structures," *IBM J. Res. Develop.* 26:568–579 (1982).

Liddle et al., "Mask Fabrication for Projection Electron–Beam Lithography Incorporating the Scalpel Technique," *J. Vac. Technol.* 9:3000–3005 (1991).

Smith et al., "A New Approach to High Fidelity e–Beam and Ion–Beam Lithography Based on an in situ Global–Fiducial Grid," *J. Vac. Sci. Technol.* 9:2992–2995 (1991).

\* cited by examiner

Primary Examiner—Bruce C. Anderson
Assistant Examiner—Nikita Wells
(74) *Attorney, Agent, or Firm*—Klarquist Sparkman Campbell Leigh & Whinston, LLP

(57) ABSTRACT

Segmented reticles are disclosed for used with charged-particle-beam projection-microlithography apparatus. Such reticles comprise multiple mask subfields and a support grid, of intersecting struts, having an upstream-facing surface and a downstream-facing surface. Alignment marks are situated on the upstream- or downstream-facing surface. The projection-microlithography apparatus comprise a beam source, an illumination system, and a subfield-selection deflector. A second deflector downstream of the reticle further deflects the beam to impart a change in a parameter of the beam to correct reticle distortion. A correction-optical system can further change one or more characteristics of the beam downstream of the reticle to correct reticle distortion. A detector determines actual alignment-mark positions relative to ideal positions, and a controller calculates therefrom a required change to be imparted to the charged particle beam to correct the reticle distortion.

44 Claims, 12 Drawing Sheets

PROJECTION-MICROLITHOGRAPHY APPARATUS, MASKS, AND RELATED METHODS INCORPORATING RETICLE-DISTORTION MEASUREMENT AND CORRECTION

FIELD OF THE INVENTION

The invention pertains to charged-particle-beam (CPB) projection-microlithography masks (reticles), apparatus, and methods for transferring a pattern, as defined by the mask, onto a sensitized substrate. The reticles, apparatus, and methods of the present invention are particularly suitable for correcting projected pattern-image errors resulting from reticle distortion, and for transferring the mask pattern onto the sensitized substrate while correcting such errors.

BACKGROUND OF THE INVENTION

In charged-particle-beam (CPB) projection microlithography as used in the fabrication of integrated circuits, a circuit pattern defined by a reticle or mask (these terms are used interchangeably herein) is irradiated with a charged particle beam to transfer the pattern defined by the reticle to a sensitized substrate (e.g., a semiconductor wafer). In recent years, CPB projection-microlithography apparatus ("pattern-transfer apparatus") have been developed that exhibit improved resolution of the transferred pattern and improved product throughput (i.e., the number of semiconductor wafers that can be exposed with a pattern per unit time). With certain conventional CPB pattern-transfer apparatus, one or more entire die patterns defined on a reticle are transferred onto the wafer in a single exposure. A "die" is a pattern coextensive with the bounds of an integrated circuit or other device to be transferred onto the wafer (usually multiple dies are exposed at respective locations on the wafer).

It is difficult to produce a reticle for a CPB pattern-transfer apparatus that transfers an entire die in a single exposure while also providing the high resolution and circuit densities demanded in recent years. In addition, conventional CPB pattern-transfer apparatus that transfer an entire die per exposure cannot satisfactorily control aberrations arising in the CPB optical system through which the charged particle beam passes, especially over a large optical field covering one or more dies. To solve this problem, CPB pattern-transfer apparatus have been proposed in which a pattern to be transferred is divided into multiple field segments (termed "mask subfields") that are individually and separately exposed. Such a pattern is typically transferred using a "step-and-repeat" transfer scheme in which the individual mask subfields are sequentially transferred to corresponding "transfer subfields" on a wafer or other sensitized substrate. The transfer subfields are produced on the wafer surface in locations relative to each other such that the transfer subfields are "stitched" together in the correct order and alignment to reproduce the entire die pattern on the wafer surface.

Various mechanical and environmental conditions can cause distortions in the mask (or reticle) from which the patterns are transferred. Such distortions include, but are not limited to, distortions that occur as a mask pattern is formed on the reticle, mechanical distortions of the reticle that occur when the reticle is mounted to a reticle stage or other reticle holder, and thermal distortions arising from changes in reticle temperature due to exposure of the reticle to a charged-particle beam. Whenever a mask pattern is transferred to a substrate using a distorted reticle, the projected mask pattern on the substrate is typically distorted. Such distortion decreases resolution of the transferred subfield images and the positional accuracy with which mask-subfield images are formed on the substrate. This results in poor accuracy with which the transfer subfields are "stitched" together.

Accordingly, there is a need to provide CPB projection-microlithography reticles, apparatus, and methods for correcting optical errors in pattern images projected from a distorted reticle before exposure of the substrate to the pattern defined by the reticle.

SUMMARY OF THE INVENTION

In light of the foregoing deficiencies in the prior art, the present invention provides charged-particle-beam (CPB) projection-microlithography reticles, apparatus, and methods (also termed "pattern-transfer reticles," "pattern-transfer apparatus," and "pattern-transfer methods", respectively) for transferring a pattern image, as defined by the reticle, onto a sensitized substrate using a charged particle beam. The pattern-transfer reticles, apparatus, and methods of the present invention provide correction of pattern-image errors resulting from a distorted reticle and provide transfer of the corrected mask-pattern images onto a substrate with high accuracy.

According to a first aspect of the invention, reticles are provided for exposing a pattern onto a sensitized substrate using a charged particle beam. According to one embodiment, such a reticle comprises a thin film defining a mask pattern, a support grid, and an alignment mark (also termed a "distortion-measurement mark"). The support grid comprises intersecting struts and has a thin-film-facing portion and an opposing surface. The thin-film-facing portion supports the thin film. The alignment mark can be formed on or in the support grid or generally on or in the thin film. The alignment mark is used for measuring reticle distortion such as before exposing a subfield of the reticle to the charged particle beam.

The membrane portions of the mask subfields are preferably very thin in the thickness dimension to suppress unwanted absorption or scattering of a charged particle beam in the reticle.

Typically, the pattern defined by the thin film is segmented into multiple mask subfields, in which instance the mask subfields are separated from one another by respective boundary regions defined on the thin film such that respective struts of the support grid surround a respective membrane of each respective mask subfield. A respective alignment mark can be situated on or in the support grid adjacent at least one corner of at least one mask subfield bounded by respective struts. Each such alignment mark is preferably a stencil mark.

The thin film and the support grid are preferably made from one body etched from a single silicon substrate. The struts of the support grid are preferably in registration with the boundary regions.

The mask subfields can be separated from one another by respective boundary regions defined on the thin film such that respective struts of the support grid surround a membrane of each respective mask subfield. In such an instance, a respective alignment mark is situated on or in the support grid adjacent at least one side of at least one mask subfield bounded by respective struts.

Further alternatively, one or more alignment marks can be situated in one or more mask subfields.

Another embodiment of a reticle according to the invention comprises a thin film defining a mask pattern divided into multiple mask subfields each comprising a membrane defining a respective portion of the mask pattern through which a charged particle beam may pass. A respective boundary region is situated between adjacent reticle membranes. A support grid, having a thin-film-facing portion and an opposing surface, of intersecting struts extends along respective boundary regions so as to support the thin film with the membranes extending between respective adjacent struts. At least one alignment mark can be situated on or in the thin film, or situated on or in the support grid for measuring and correcting distortion of the reticle, such as before exposing a mask subfield to the charged particle beam. Such a reticle preferably has multiple alignment marks situated at prescribed locations on or in the support grid or on or in the thin film. The alignment marks can face downstream during use of the reticle for exposing the sensitized substrate to the mask pattern. A respective alignment mark can be situated on or in the boundary region at each location where struts intersect one another. Alternatively, a respective alignment mark can be situated on the thin film at each location corresponding to a midpoint of a side of a respective mask subfield. Further alternatively, certain mask subfields can include one or more alignment marks.

According to another aspect of the invention, charged-particle-beam (CPB) projection-microlithography apparatus are provided. With respect to one embodiment of such an apparatus, a beam source emits a charged particle beam along an optical axis. An aperture, located on the optical axis downstream of the beam source, limits a transverse area of the charged particle beam passing through the aperture. A reticle stage, situated downstream of the aperture, holds a segmented reticle comprising a pattern-defining thin film and a support grid. (The support grid preferably comprises at least one alignment mark situated on or in an upstream- or downstream-facing surface of the support grid. More generally, the thin film can include one or more alignment marks.) A first deflector is provided for selectively deflecting the charged particle beam, passing through the aperture, to a selected mask subfield on the reticle mounted to the reticle stage so as to irradiate the selected mask subfield. A first detector is situated relative to the reticle so as to detect a position of the alignment mark. The first detector produces data corresponding to the position of the alignment mark indicative of a possible distortion of the reticle. The first detector is connected to a controller. A projection system is located downstream of the reticle for refracting the charged-particle beam passing through the reticle so as to form an image of the irradiated mask subfield on a corresponding location on a surface of a sensitized substrate. A correction-optical system is situated between the reticle and the substrate and is connected to the controller. The correction-optical system selectively alters, as commanded by the controller, a parameter of the charged particle beam so as to correct the reticle distortion based on data produced by the first detector and processed by the controller.

The apparatus summarized above can comprise a second deflector situated downstream of the reticle stage for selectively deflecting the charged particle beam transmitted through the reticle. The second deflector is connected to the controller, wherein the controller selectively and individually commands the second deflector in concert with the correction-optical system to apply a deflection to the charged particle beam as required to correct the reticle distortion.

The controller preferably comprises a memory that stores data pertaining to initial positions of the alignment marks on the reticle and receives and stores data pertaining to actual positions of the alignment marks on the reticle as detected by the first detector. Such data is used by the controller to determine a change in an actual position relative to an initial position indicating a corresponding reticle distortion. The data are also used by the controller to calculate from the determined change a required change in at least one parameter of the charged particle beam as projected on the substrate to correct the reticle distortion. The controller preferably produces an output signal corresponding to the data on actual positions versus the data on corresponding initial positions of the alignment marks.

The controller can further comprise an arithmetic/logic unit. Such a unit recalls data from the memory so as to calculate the change in the actual positions relative to the initial positions of the alignment marks indicating an intervening reticle distortion. The unit also calculates from the calculated change a required correction to an image of the irradiated mask subfield on the substrate to eliminate adverse effects on the image of the reticle distortion. The unit also produces an electrical signal corresponding to the required correction, and routes the electrical signals to the correction-optical system to perform the required correction.

The correction-optical system preferably comprises at least one of a magnification-correction lens, a rotation-correction lens, and a stigmator.

The first detector is preferably situated and configured to detect charged particles from the charged particle beam that propagate from the alignment mark to the first detector due to impingement of the charged particle beam on the alignment mark. For example, if the charged particle beam is an electron beam, the first detector detects electrons reflected or otherwise propagating from the alignment mark. The apparatus can further comprise a second detector that detects electrons reflected or otherwise propagating from the alignment mark.

The alignment mark(s) can be situated so as to receive an energy beam that interacts with the alignment mark(s) in a way that is detectable by the first detector to produce the data corresponding to the position of the alignment mark. Such an energy beam can be a charged particle beam (e.g., electron beam), which can be a separate charged particle beam from the charged particle beam used to illuminate the mask subfield. The energy beam can alternatively be a beam of electromagnetic radiation.

According to another aspect of the invention, methods are provided for correcting an error in an image of a portion of a reticle and for projecting a corrected image of the reticle portion onto a sensitized surface of a substrate using a charged particle beam. According to one embodiment of such a method, a reticle is provided that comprises a thin film defining a pattern segmented into multiple mask subfields. Each mask subfield comprises a membrane defining a respective portion of the mask pattern through which a charged particle beam may pass, and the reticle membranes are separated from one another by boundary regions. The reticle can further comprise a support grid of intersecting struts coextensive with the boundary regions. Alignment marks are individually situated on or in either a downstream- or upstream-facing surface of the support grid at respective prescribed locations around a respective reticle membrane. Alternatively, each of certain reticle membranes can include at least one alignment mark. Typically before exposing a selected mask subfield to the charged particle beam to projection-expose the pattern portion defined by the respective reticle membrane onto the substrate, the following are performed: (a) an initial position of the respective reticle membrane is determined at a first moment in time; (b) data corresponding to the determined initial position are stored in a memory; and (c) an actual position of the respective reticle membrane is determined by detecting, at a subsequent second moment in time, positions of the alignment marks. Thus, actual-position data for the reticle membrane are produced. The initial-position data are recalled. The actual-position data are compared with the recalled initial-position data to obtain data concerning a type and amount of correction required to make the actual position coincide with the initial position (the correction can be to at least one of scaling, rotation, and astigmatism errors resulting from distortion of the reticle arising between the first and second moments in time). Based on such data, a characteristic of the charged particle beam is changed to correct the error(s) by the determined correction amount. The selected mask subfield is exposed using the corrected charged particle beam to form an image of the respective reticle membrane on the substrate.

According to another embodiment of a projection-exposure method according to the invention, multiple distortion-measurement marks are provided on the reticle. The reticle is placed on a reticle stage that holds the reticle for projection-exposure of the mask pattern. An energy beam is directed at the distortion-measurement marks on the reticle to allow the energy beam to interact with the individual distortion-measurement marks. A component of the energy beam, propagating from the individual distortion-measurement marks as a result of interaction of the energy beam with the respective distortion-measurement marks, is detected so as to measure an actual position of the respective distortion measurement marks. The actual positions are compared with ideal positions (e.g., recalled from a memory) of the distortion-measurement marks, and a reticle distortion is calculated from such comparisons. In such a method, the energy beam can be the charged particle beam used to projection-expose the mask pattern. Alternatively, the energy beam can be separate from the charged particle beam used to projection-expose the mask pattern.

According to another embodiment of a method according to the invention, a charged particle beam is directed in sequence at multiple distortion-measurement marks on a reticle mounted on a reticle stage of the projection-exposure apparatus. Particles from the charged particle beam reflected from the distortion-measurement marks are detected. From data produced from such detection, the respective actual positions of the distortion-measurement marks are determined. Data on the respective actual positions are compared with corresponding data on respective ideal positions of the distortion-measurement marks. From such comparisons, distortion of the reticle is calculated. Preferably, the distortion is corrected before projection-exposing a corresponding region of the reticle. Such correction is typically made by changing a parameter of the charged particle beam.

According to yet another embodiment of a method according to the invention, a charged particle beam (as used for projection-exposure of the reticle) is directed at a plurality of distortion-measurement marks situated on a reticle mounted on a reticle stage of the projection-exposure apparatus. The distortion-measurement marks are preferably permeable to the charged particle beam such that a portion of the charged particle beam passes through the distortion-measurement marks and strikes corresponding reference marks situated on a substrate stage on which the substrate is mounted during projection-exposure. Particles of the charged particle beam propagating from the reference marks due to interaction of charged particles from the distortion-measurement marks with the reference marks are detected. From such detections, actual positions of each of the distortion-measurement marks are determined. The data concerning the actual positions of the marks are compared to data concerning ideal positions of the distortion-measurement marks. From such comparisons, reticle distortion is calculated. Based on the reticle distortion, a change can be imparted to the charged particle beam so as to correct the reticle distortion before projection-exposing the reticle.

The foregoing and additional features and advantages of the invention will be more readily apparent from the following detailed description, which proceeds with reference to the following drawings.

BRIEF DESCRIPTION OF THE DRAWINGS

FIGS. 4(a)–4(d) are plan views of the reticle of FIG. 3(a) in various respective distorted conditions, wherein FIG. 4(a) illustrates a scaling error, FIG. 4(b) illustrates a rotational error, FIG. 4(c) illustrates an orthogonality (astigmatic) error, and FIG. 4(d) illustrates a positioning error.

FIGS. 9(a)–9(b) pertain to a ninth representative embodiment of the invention, namely a reticle wherein FIG. 9(a) is a schematic plan view of the reticle, and FIG. 9(b) is a schematic elevational section along the line B—B in FIG. 9(a).

DETAILED DESCRIPTION

Various aspects of the invention are described below in connection with multiple representative embodiments.

For convenience, the present invention is described primarily with reference to use of an electron beam (as a representative charged particle beam) to expose a mask pattern onto a semiconductor wafer. It will be understood, however, that the reticles, apparatus, and methods of the present invention apply equally well to other CPB sources, reticles, and various other suitable substrates, respectively. Further, although a scattering-membrane reticle is described herein by way of example, it will be understood that a scattering-stencil reticle, wherein the substrate is the scatterer and the pattern is void, may also be used to form reticles according to the present invention.

First Representative Embodiment

Figure 1A:
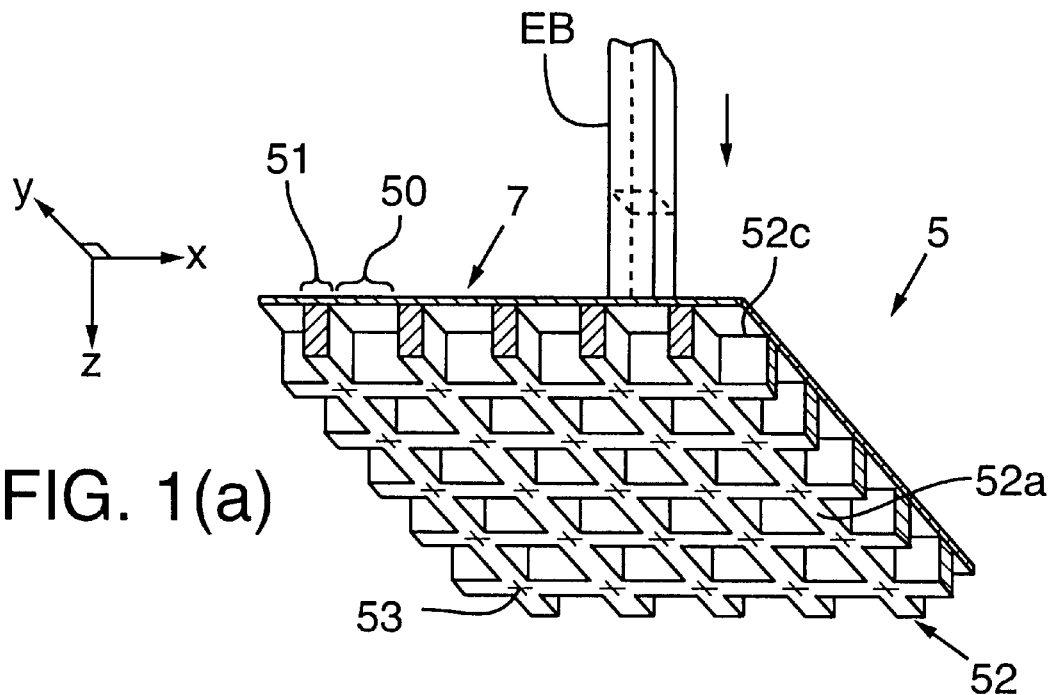
FIG. 1(a) is a perspective view of a first representative embodiment of the invention, namely a segmented reticle not exhibiting any distortion.
Figure 1B:
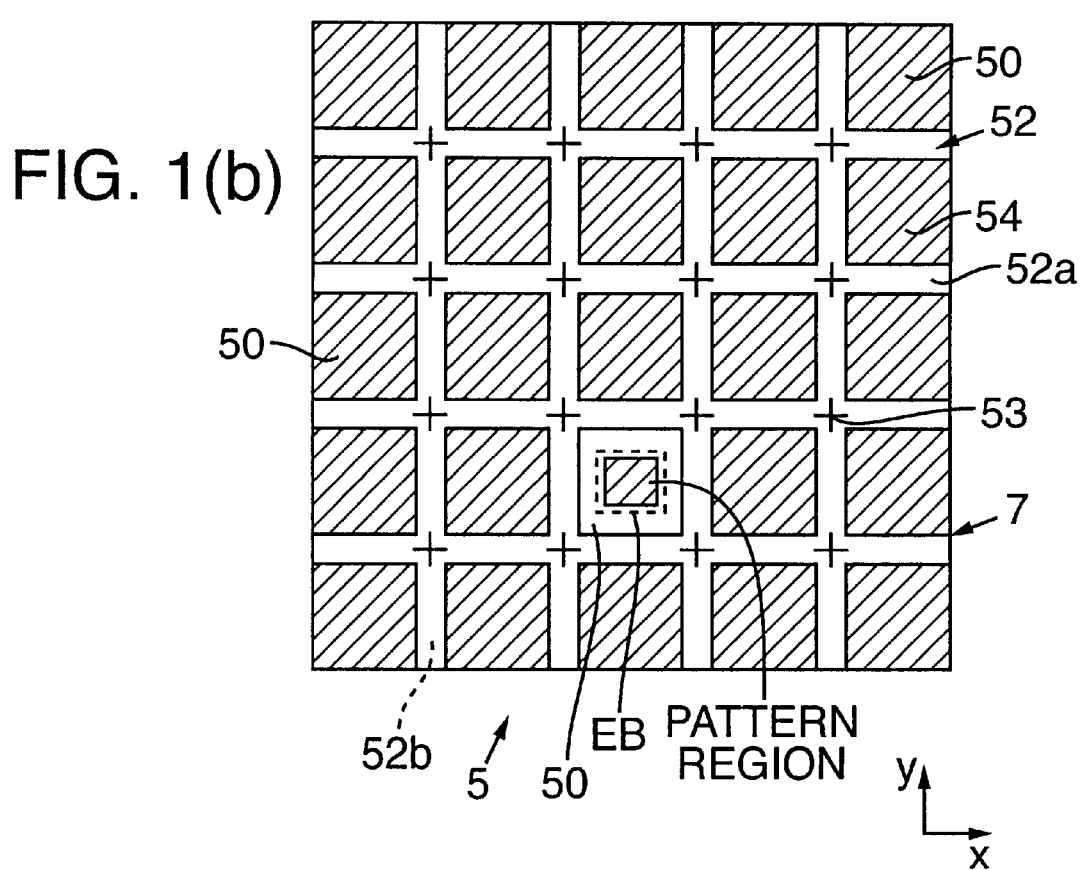
FIG. 1(b) is a plan view of the downstream-facing surface of the reticle shown in FIG. 1(a).

Referring to FIGS. 1(a) and 1(b), a first representative embodiment of a segmented reticle 5 according to the invention comprises a uniform-thickness thin film 7 that is transmissive to charged particles. The thin film 7 defines features of a pattern to be transferred from the reticle 5 to a sensitized substrate. The thin film 7 is divided into multiple "mask subfields" or 50 each comprising a membrane defining a respective portion of the pattern.

Specifically, in this embodiment, within each mask subfield 50 are regions in which a charged-particle-scattering material is deposited on the upstream-facing surface (upward-facing surface in the figure) of the thin film 7. Spaces located between such regions define, in conjunction with such regions, in each mask subfield 50 the respective portion of the pattern defined by the reticle 5. Each mask subfield 50 is separated from its neighboring mask subfields by an intervening respective non-pattern area or "boundary region" 51. The boundary regions 51 typically do not define any portion of the mask pattern.

Integral with the reticle thin film 7 is a support grid 52. The support grid 52 and thin film 7 form the boundary regions 51. In this embodiment, the thin film 7 and the support grid 52 are preferably made from one body (e.g., etched from a single silicon substrate). The support grid 52 comprises a comparatively rigid lattice of intersecting struts extending across the respective surface of the reticle. The support grid 52 serves, inter alia, to thermally and mechanically support the thin film 7.

In this first representative embodiment of the reticle 5 as shown in FIGS. 1(a) and 1(b), the boundary regions 51 are integral with and coextensive with the struts. Thus, each mask subfield 50 is separated from all adjacent mask subfields by a strut. Representative methods for forming such a reticle are disclosed in, e.g., U.S. patent application Ser. No. 08/956,690 filed on Oct. 24, 1997, incorporated herein by reference.

More particularly, the support grid 52 is integral with the thin film 7 at a position 52c (on an upstream-facing "surface" 52a of the support grid 52), and has an opposing downstream-facing surface 52b. The support grid at position 52c is integral with the thin film, together forming the boundary regions 51. The reticle 5 further comprises alignment marks 53 formed in or on the surface 52a of the support grid 52. Whenever the reticle 5 is placed in a pattern-transfer apparatus according to the invention, the surface 52a and alignment marks 53 preferably face downstream toward a substrate 11 (see FIG. 2). Alternatively, the reticle 5 can be placed and used in the apparatus with the opposing surface and alignment marks 53 facing upstream.

In the embodiment of the reticle 5 shown in FIGS. 1(a) and 1(b), an alignment mark 53 is formed preferably at each location where struts of the support grid 52 intersect each other. It is not necessary, however, to have an alignment mark at each such location. If the reticle distortion is typically minor, fewer alignment marks are required to correct a projected image for such distortion. The alignment marks 53 preferably comprise a heavy metal, e.g., tantalum, and are preferably formed using suitable thin-film deposition techniques known to persons of ordinary skill in the art. However, the alignment marks 53 may be formed using any of various other techniques known to persons of ordinary skill in the art.

Second Representative Embodiment

Figure 2:
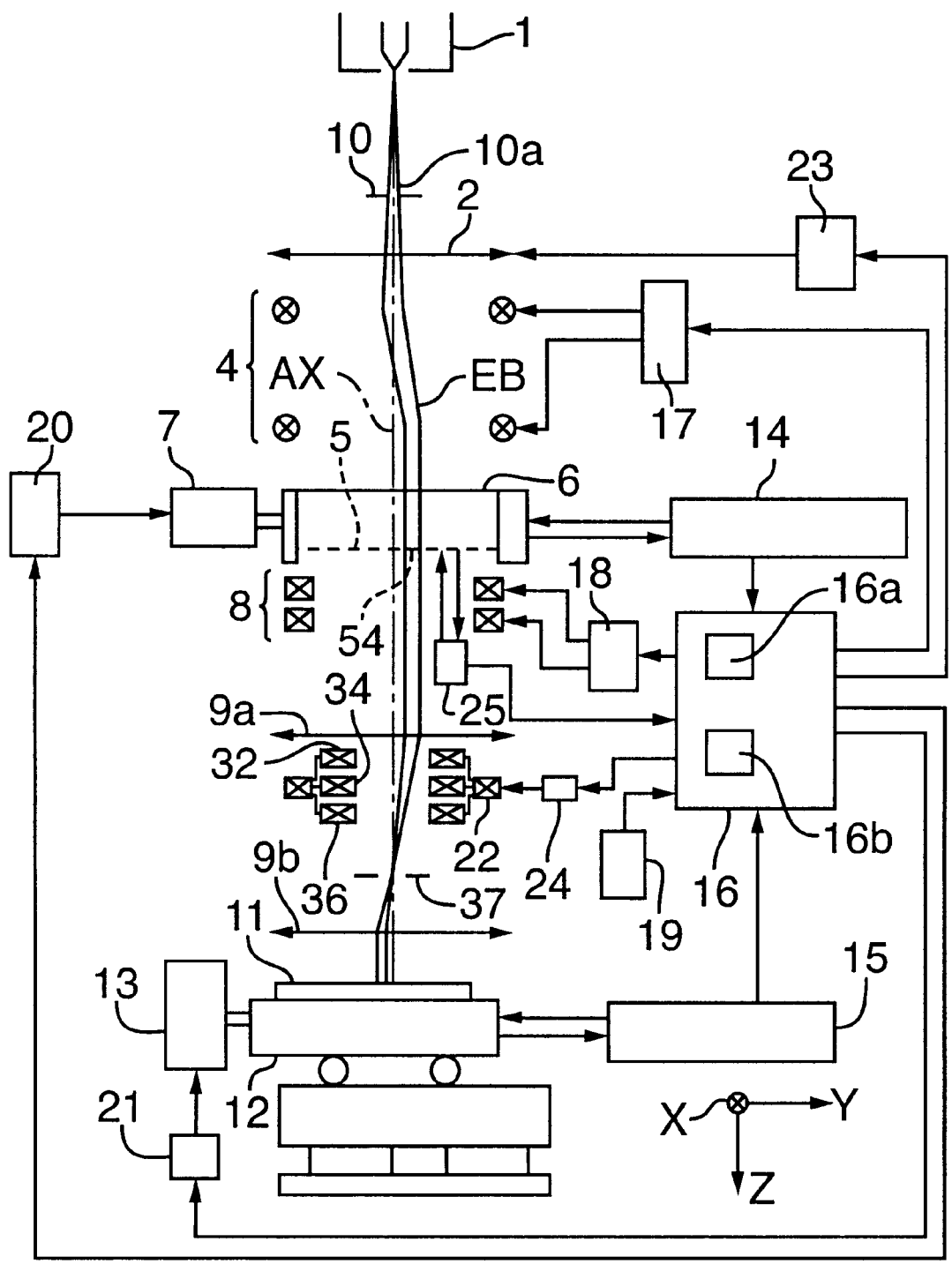
FIG. 2 is an elevational schematic diagram of a second representative embodiment of the invention, namely a pattern-transfer apparatus for use with an electron-beam as the charged particle beam.

This representative embodiment is directed to a CPB pattern-transfer apparatus that can be used in conjunction with, e.g., a reticle according to the first representative embodiment. The apparatus, as depicted schematically in FIG. 2, is described as employing an electron beam as a representative charged particle beam. In FIG. 2, the Z-axis is parallel to the initial trajectory axis (i.e., the optical axis AX) of the electron beam EB, the Y-axis extends in a direction horizontal with the plane of the page, and the X-axis extends in a direction perpendicular to the plane of the page.

The FIG. 2 apparatus comprises, along the optical axis AX in the trajectory direction of an electron beam EB, an electron gun 1 that emits an electron beam. An aperture stop 10 (defining an aperture 10a) is positioned downstream of the electron gun 1 to limit the transverse profile of the divergent electron beam EB emitted from the electron gun 1 to desired dimensions. A condenser lens 2 is positioned downstream of the aperture 10a to illuminate the reticle 5. The condenser lens 2 substantially collimates the electron beam for illumination of a selected mask subfield, and is controlled by a condenser-lens controller 23 connected to a master controller 16. A membrane-selection deflector (also termed a "first deflector" or a "subfield-selection deflector") 4 deflects the electron beam EB that passes through the condenser lens 2 to the selected mask subfield 50 of the reticle 5. The membrane-selection deflector 4 is operated by a first deflector driver 17 connected to and controlled by the master controller 16.

Figure 5:
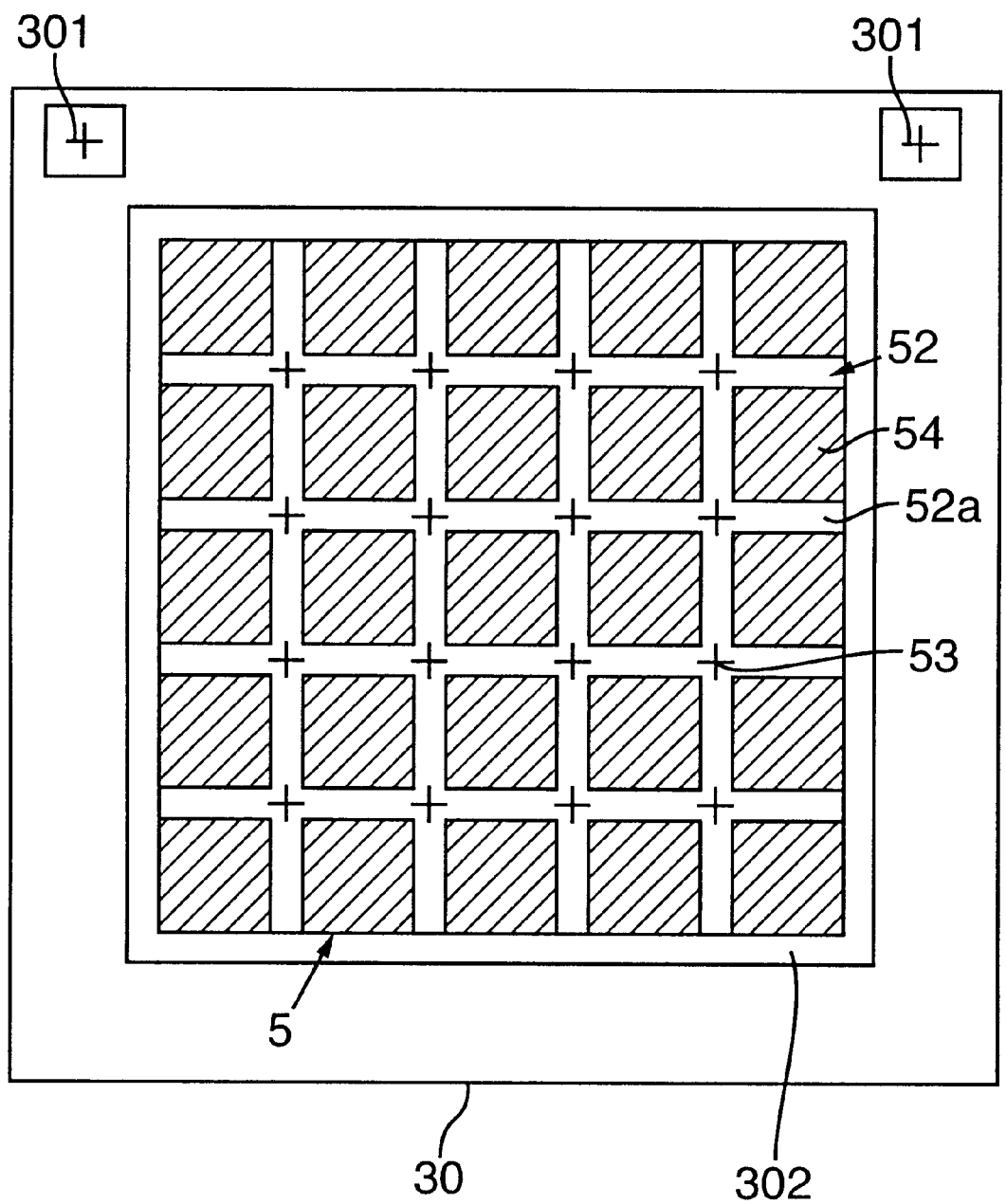
FIG. 5 is a plan view of a seventh representative embodiment of the invention, namely a reticle mounted on a reticle holder.

The reticle 5 (such as a reticle according to the first representative embodiment) is mounted on a reticle stage 6 so as to extend in the X-Y plane. The reticle stage 6 is driven by a reticle-stage driver 7 so as to be movable along the X-axis and Y-axis directions. The reticle-stage driver 27 is controlled by a reticle-stage controller 20 connected to and controlled by the master controller 16. In mounting the reticle 5 to the reticle stage 6, the reticle 5 can be mounted on a reticle holder 30 (an example is shown in FIG. 5 and discussed below) that is, in turn, mounted on the reticle stage 6. The position of the reticle stage 6 along the X-axis and Y-axis is detected by a reticle-stage detector 14. The reticle-stage detector 14 preferably comprises a laser interferometer that is connected to the master controller 16 and provides data, indicative of the detected position of the reticle stage 6, to the master controller 16.

A second deflector 8 deflects the electron beam EB that passes through the selected mask subfield 50 of the reticle 5. The second deflector 8 is operated by a second deflector driver 18 connected to and controlled by the master controller 16. A projection-optical system, preferably comprising first and second projection lenses 9a, 9b, is positioned downstream of the second deflector 8 to form an image of the transmitted reticle-membrane pattern on the sensitized surface of the substrate 11 (e.g., semiconductor wafer).

Further with respect to FIG. 2, a correction-optical system 22 is preferably situated between the reticle 5 and substrate 11. A representative embodiment of the correction-optical system 22 comprises a magnification-correction lens 32, a rotation-correction lens 34, and an astigmatism-correction lens or "stigmator" 36. The respective position of each of the lenses between the reticle 5 and substrate 11 is variable, and is typically determined based on the total aberration collectively exhibited by the lenses. Furthermore, the correction-optical system 22 may comprise multiple lenses, e.g., two or more magnification lenses, stigmators, etc.

The correction-optical system 22 is operated by a correction-system driver 24 connected to and controlled by the master controller 16. A back-focal-plane aperture (or contrast-aperture stop) 37 is preferably positioned downstream of the correction-optical system 22 and upstream of the second projection lens 9b. The back-focal-plane aperture 37 blocks passage of electrons that may have been scattered at relatively large angles by the reticle.

A mark-detection system 25 is situated downstream of the reticle 5, preferably between the second deflector 8 and the first projection lens 9a. The mark-detection system 25 directs an energy beam (e.g., light beam) toward, and detects the actual positions of, the alignment marks 53 on the reticle 5 by detecting portions of the energy beam reflected from the alignment marks 53. The mark-detection system 25 thus provides data indicative of the detected positions of the alignment marks 53 to the master controller 16. The mark-detection system 25 preferably comprises any detector suitable for use with various CPB alignment systems, such as detectors suitable for use with Field-Image Alignment systems, Laser-Step Alignment systems, and Laser-Interferometric Alignment systems. The mark-detection system 25 most preferably comprises a Field-Image Alignment System, including an illumination source (e.g., white light) (not shown) and a CCD camera (not shown).

The substrate 11 is preferably mounted on a substrate stage 12 so as to be parallel to and movable in the XY plane. The upstream-facing surface of the substrate 11 is typically coated with a suitable resist or other "sensitizing" substance that is sensitive to exposure to the particles in the charged particle beam in an image-forming way. The substrate stage 12 is driven by a substrate-stage driver 13. The substrate-stage driver 13 is operated by a stage-driver controller 21 that is connected to and controlled by the master controller 16. The substrate-stage driver 13 moves the substrate stage 12, and hence the substrate 11, in both the X-axis and Y-axis directions. A substrate-stage detector 15, connected to the master controller 16, determines the position of the substrate stage 12 along the X-axis and the Y-axis, and supplies data indicative of that position to the master controller. The substrate-stage detector 15 preferably comprises a laser interferometer.

The master controller 16 preferably comprises a memory 16a and an arithmetic/logic unit 16b. An input device 19 (e.g., keyboard, mouse, memory readout device) can be connected to the master controller 16 for the input of data as required to the memory device 16a for correcting any pattern-image error resulting from distortion of the reticle 5 (as discussed below).

During operation of a pattern-transfer apparatus according to this embodiment, initial position data for the alignment marks 53 (i.e., "initial positions" or "design positions") are determined and stored in the memory device 16a of the master controller 16. The mark-detection system 25 detects the coordinates of the "actual" positions of the alignment marks 53 when the reticle 5 is mounted in the pattern-transfer apparatus. Whenever the mark-detection system 25 comprises a Field-Alignment system as described above, the mark-detection system 25 detects only the coordinate position of the alignment mark 53 within the field of the CCD camera. Accordingly, the "actual" position of each alignment mark 53 is determined relative to the interferometer coordinate determined by the reticle-stage detector 14. The arithmetic/logic unit 16b then calculates the actual position of the respective alignment marks 53 based on the data supplied thereto by the mark-detection system 25 and the reticle-stage detector 14.

Specifically, before or during exposure of each mask subfield 50 by the FIG. 2 embodiment, the arithmetic/logic unit 16b calculates the actual positions of the respective alignment marks 53 based on data supplied by the mark-detection system 25, the position of the reticle 5 as detected by the reticle-stage detector 14, and the position of the substrate 11 as detected by the substrate-stage detector 15. The calculated actual positions of the alignment marks 53 can be stored in the memory device 16a for later recall as required.

The arithmetic/logic unit 16b then computes correction data required to correct distortion of the reticle 5. Such correction is based on the stored data (in the memory device 16a) regarding the initial and actual positions of the alignment marks. Based on the determination of the extent and nature of distortion of the reticle 5 and corresponding correction necessary, as determined by the arithmetic/logic unit 16b, the master controller 16 sends corresponding distortion-correction signals to one or more of the various drivers 23, 17, 18, 24 to appropriately adjust an operational parameter of one or more of the condenser lens 2, the first deflector 4, the second deflector 8, and the correction-optical system 22, respectively.

Detected rotational, magnification (i.e., scaling), and astigmatism (i.e., orthogonality) errors of the reticle subfields due to reticle distortion, are corrected by appropriate deflection of the electron beam EB by the second deflector 8 and further manipulation of the electron beam by the correction-optical system 22, as discussed below.

Third Representative Embodiment

Figure 1C:
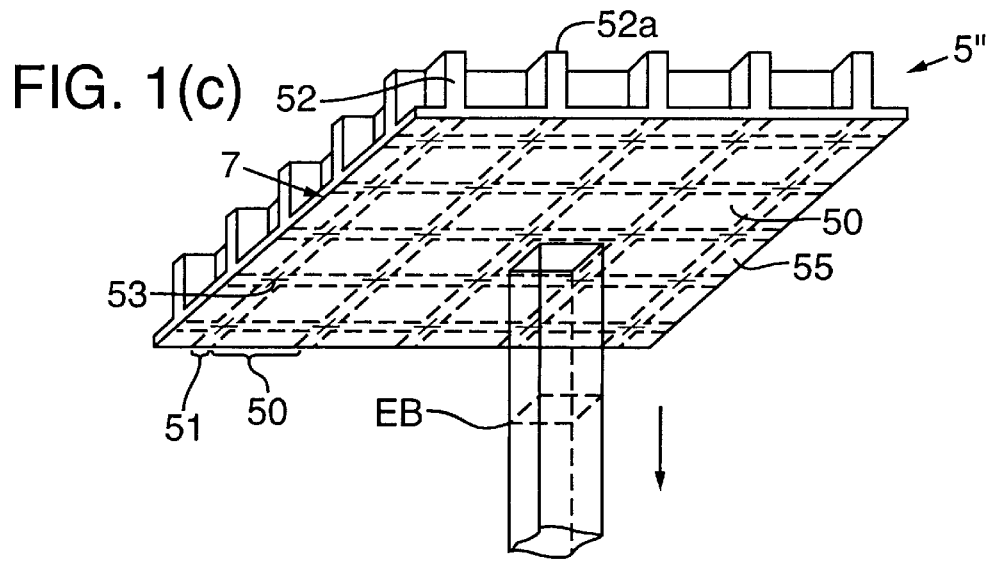
FIG. 1(c) is a perspective view of a third representative embodiment of the invention, namely a segmented reticle not exhibiting any distortion.
Figure 1D:
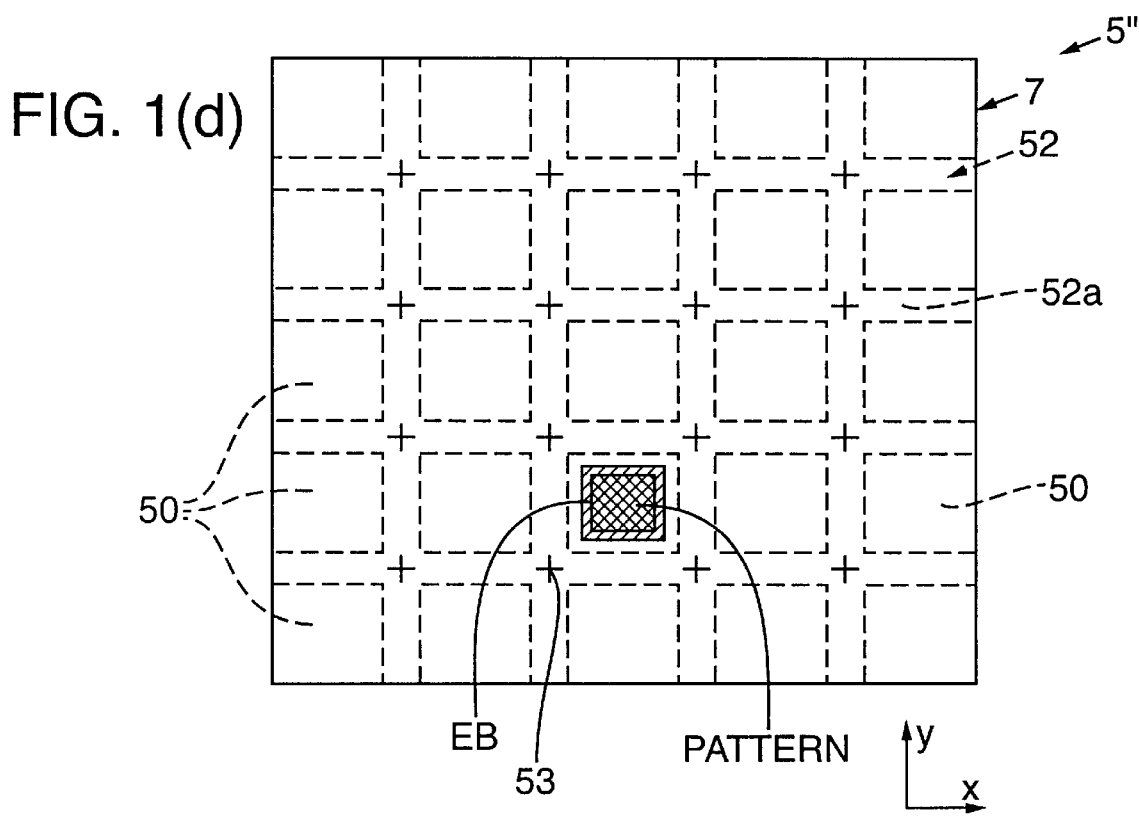
FIG. 1(d) is a plan view of the downstream-facing surface of the reticle shown in FIG 1(c).

Referring to FIGS. 1(c) and 1(d), a segmented reticle 55 according to this embodiment is illustrated. The reticle 55 of FIGS. 1(c)–1(d) is similar to a reticle 5 according to the first representative embodiment with the exception of the placement of the alignment marks 53 on the support grid 52. Specifically, the alignment marks 53 are formed in or on the upper surface of the reticle 55 on the boundary regions formed by the thin film 7 and the support grid 52. Hence, the alignment marks 53 are located immediately adjacent the mask subfields 50, preferably at each location where struts of the support grid 52 intersect each other. Accordingly, whenever the reticle 55 is placed in a pattern-transfer apparatus according to the invention, the reticle upper surface 55a and alignment marks 53 preferably face downstream toward the substrate 11 (see FIG. 2).

Fourth Representative Embodiment

Figure 1E:
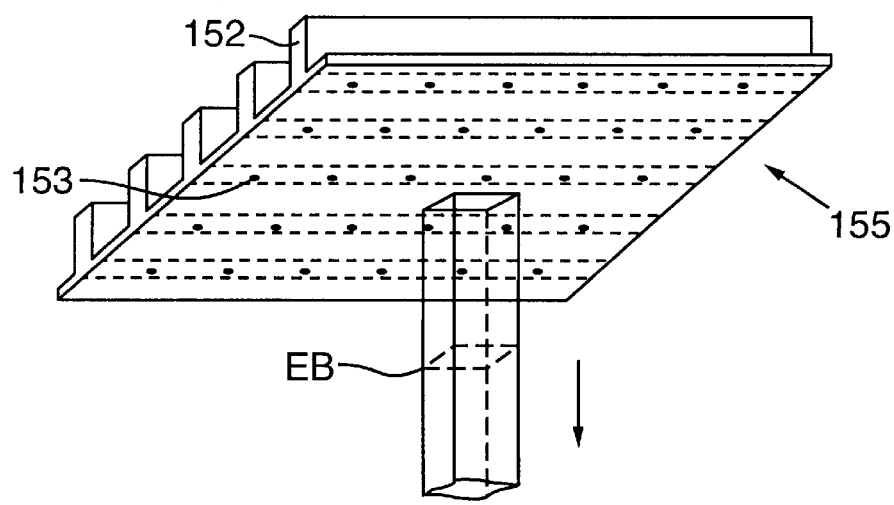
FIG. 1(e) is a perspective view of a fourth representative embodiment of the invention, namely a segmented reticle not exhibiting any distortion.
Figure 1F:
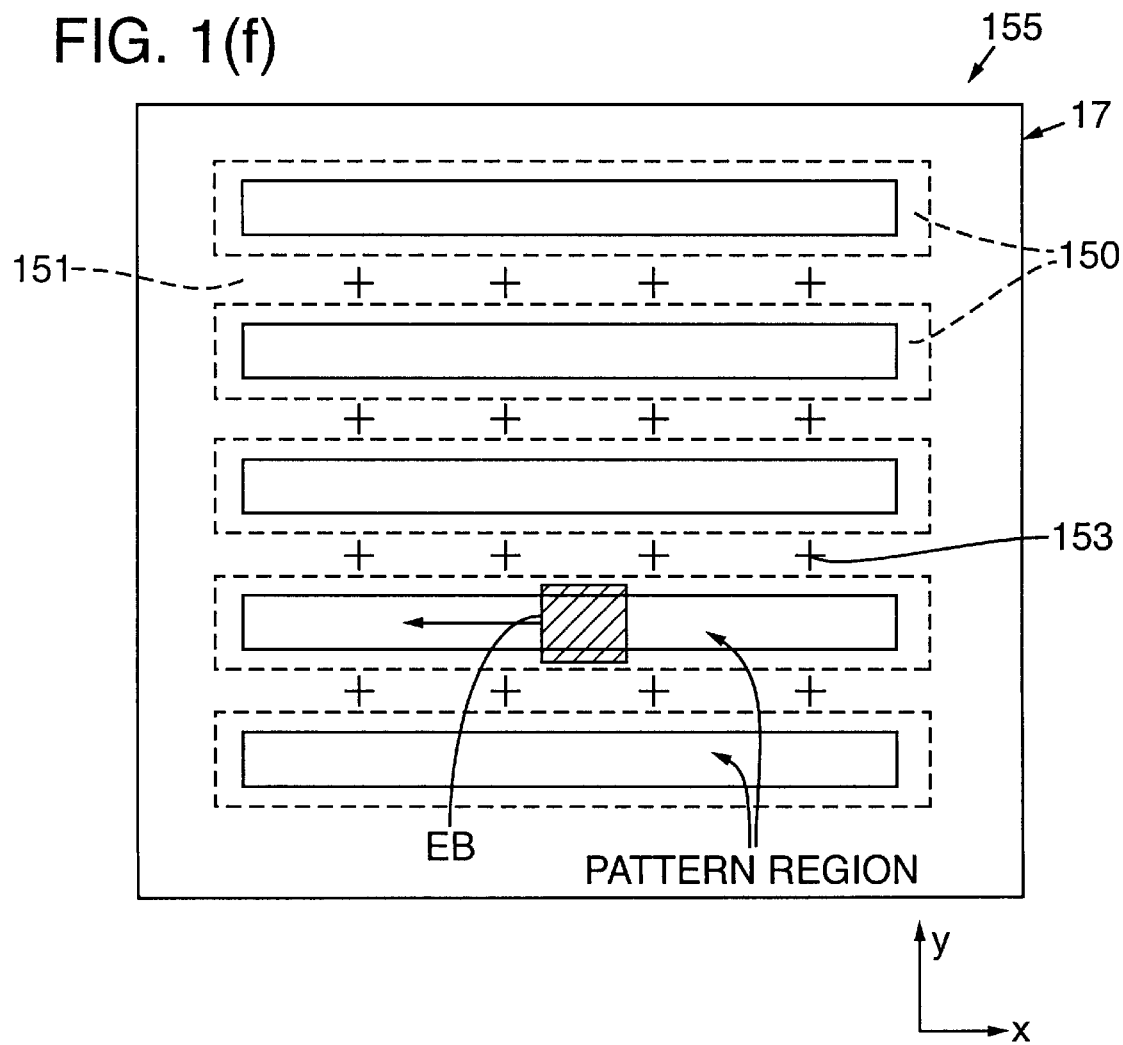
FIG. 1(f) is a plan view of the downstream-facing surface of the reticle shown in FIG. 1(e).

Referring to FIGS. 1(e) and 1(f), a segmented reticle 155 according to this embodiment is illustrated. As with the first and third representative embodiments described above, the reticle 155 of this representative embodiment comprises a thin film 170 defining features of a pattern to be transferred from the reticle to a sensitive substrate. The thin film 170 is divided into multiple mask subfields 150 each defining a respective portion of the pattern. Each mask subfield 150 is shaped to form an elongated rectangle or "stripe" extending across a substantial portion of the width, on the downstream surface, of the reticle 155. The mask subfields 150 are separated from one another by an intervening respective non-pattern area or boundary region 151.

A support grid 152 supports the thin film 170. The support grid 152 and the thin film 170 are preferably integrally connected together, in which instance they can be formed by etching a single silicon substrate. The support grid 152 and the thin film 170 form the boundary regions 151. However, unlike the first and third representative embodiments described above, the support grid 152 of this embodiment forms multiple parallel struts extending across the reticle 155. I.e., because the mask subfields 150 extend across substantially the entire width of the reticle 155 rather than forming multiple reticle subfields across the reticle width, the support grid 152 of this embodiment does not form a "checkerboard" lattice structure, as formed in the first and third representative embodiments.

Furthermore, although FIG. 1(f) shows only five mask subfields 150 (i.e., five stripes), if reticle distortion results in significantly large aberrations of the projected images of respective mask subfields, the width and length of the stripes can be made smaller while the number of mask subfields defining the pattern to be transferred is increased. Accordingly, there may be more than one stripe or mask subfield extending across the width of the reticle, resulting in a pattern more closely resembling a checkerboard pattern but with rectangular-shaped mask subfields rather than substantially square-shaped subfields.

The boundary regions 151 are in registration with the struts. Alignment marks 153 are formed on or in the support grid on the downstream surface of the reticle 155, in the same manner as described above with respect to the first representative embodiment of the reticle.

Fifth Representative Embodiment

Figure 3A:
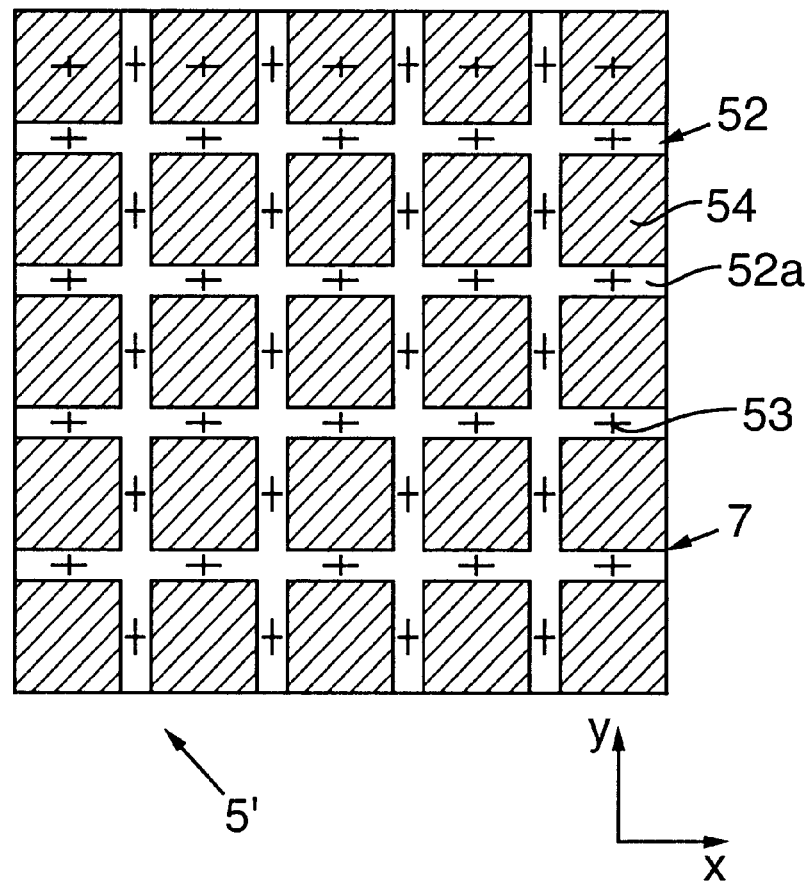
FIG. 3(a) is a plan view of a portion of a fifth representative embodiment of the invention, namely a reticle not exhibiting any distortion.
Figure 3B:
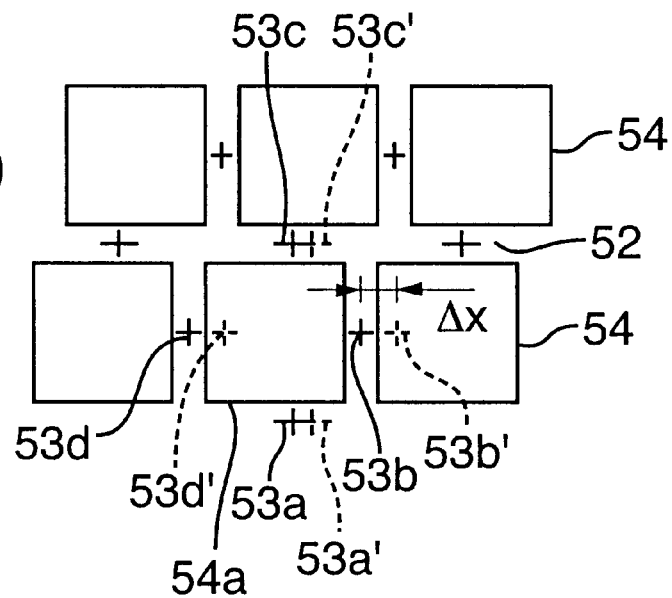
FIG. 3(b) is a plan view of the reticle of FIG. 3(a) in an exemplary distorted condition.

A segmented reticle 5', according to this embodiment, not exhibiting any distortion is shown in FIG. 3(a). FIG. 3(b) illustrates representative positional errors in the pattern image of certain reticle subfields (relative to other reticle subfields) resulting from one type of distortion of the reticle 5' of FIG. 3(a). Whereas the alignment marks 53 of the FIG. 1(b) embodiment are situated where struts intersect (at each of the four corners of each subfield 50), the alignment marks 53 of the reticle 5' of the FIG. 3(a) embodiment are situated at a midpoint of each respective side of each respective subfield 50.

As illustrated in FIG. 3(b), reticle distortion has resulted in a second row (lower row in the figure) of reticle subfields being shifted by an amount $\Delta X$ along the $-X$-axis direction. The positional error of each shifted subfield 50 can be determined by comparing the position data for the alignment marks 53a–53d of the respective shifted subfield with the corresponding alignment marks 53a'–53d' of the respective non-shifted subfield. Such determinations can be performed using a pattern-transfer apparatus according to the second representative embodiment (FIG. 2).

More specifically, position data on the alignment marks 53a'–53d' for a subfield on an undistorted reticle 5' (i.e., the marks shown by dashed lines) are detected by the mark-detection system 25 and stored in the memory 16a as "initial" alignment-mark positions. Similarly, position data on alignment marks 53a–53d for the respective subfield on a distorted reticle 5' (i.e., the marks shown by solid lines) are detected by the mark-detection system 25 and stored in the memory 16a as "actual" alignment-mark positions. The actual alignment-mark positions are compared by the master controller 16 with the initial alignment-mark positions. From such a comparison, the positional error for the respective subfield 50 is determined. Similar positional errors, if any, are determined for other subfields of the reticle.

The positional errors can be corrected by manipulating the electron beam EB using the correction lenses 32, 34, 36 of the correction-optical system 22. Such manipulation is responsive to corresponding "corrective" signals delivered to the correction-system driver 24 by the master controller 16. Alternatively or in addition, the master controller 16 can send "corrective" signals to one or more of the condenser lens 2 (via the condenser-lens controller 23), the membrane-selection deflector 4 (via the first deflector driver 17), and the second deflector 8 (via the second deflector driver 18).

Figure 4A:
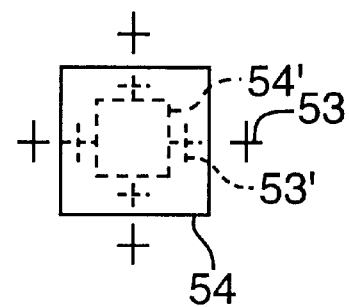
Figure 4B:
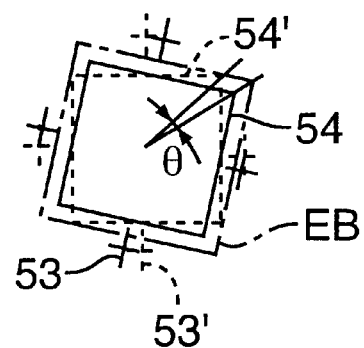
Figure 4C:
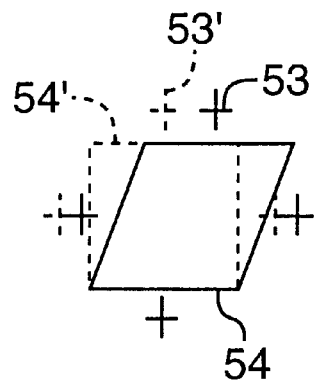
Figure 4D:
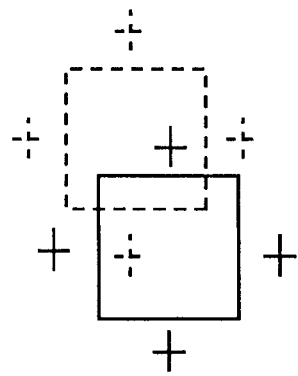

FIGS. 4(a)–4(d) show reticle subfields 50 that have experienced various distortion errors. Specifically, FIG. 4(a) shows a reticle subfield 50 that has experienced a scaling (i.e., magnification) error due to reticle distortion; FIG. 4(b) shows a subfield 50 that has experienced a rotational error due to reticle distortion; FIG. 4(c) shows a subfield 50 that has experienced an error in orthogonality or astigmatism due to reticle distortion; and FIG. 4(d) shows a subfield 50 that has experienced positioning errors due to reticle distortion.

In FIG. 4(a), the reference numerals 53' and 50' denote the alignment marks and corresponding subfield (dashed lines), respectively, before any distortion of the reticle. The reference numerals 53 and 50 denote the alignment marks and corresponding subfield (solid lines), respectively, following reticle distortion.

Correction of a scaling error such as shown in FIG. 4(a) can be made by manipulating the magnification-correction lens 32, such that the transverse area of the electron beam EB is increased. Magnification-error correction of the electron beam EB that passes through the selected subfield 50 of the distorted reticle 5' can be further made by changing an operational parameter of the magnification-correction lens 32 of the correction-optical system 22 so that a desired mask-pattern image is formed at the desired position on the substrate 11.

In FIG. 4(b), the subfield 50 is rotated to the right by an angle $\theta$ (rotated image shown by the solid line). To correct such a rotational error, the rotation-correction lens 34 (as controlled by the master controller 16) rotates the electron-beam image of the aperture 10a to the left by the angle $\theta$ (see dashed line).

To correct an orthogonality error as shown by the solid lines in FIG. 4(c), the image of the irradiated reticle subfield can be rotated using the stigmator 36.

Positional errors, such as shown in FIG. 4(d), are corrected in the manner discussed above in relation to the reticle embodiment illustrated in FIG. 3(b).

The actual respective positions of the alignment marks 53 for all the individual subfields 50 can be determined prior to exposing any of the subfields 50 of the reticle 5. The necessary manipulation of the electron beam is then calculated in advance for each reticle subfield. Then, mask subfields 50 are sequentially transferred by projection exposure to the substrate 11 subfield-by-subfield and row-by-row. After each row of subfields 50 has been transferred, the reticle 5 and substrate 11 are shifted in opposite directions along the X-axis (FIG. 1(b)) to permit the next row of subfields to be transferred. During such transfer, the boundary regions 51 do not appear between adjacent "transfer subfields" on the substrate. I.e., the transfer subfields are "stitched" together and made contiguous with each other on the substrate without intervening boundary regions.

Alternatively, any required correction of pattern-image errors following measurement of the actual positions of the alignment marks 53 for each respective reticle subfield 50 can be performed immediately prior to exposure of each particular reticle subfield 50. Accordingly, the pattern-image error correction is made before the transfer of each subfield, subfield-by-subfield and row-by-row. In this case, distortion accompanying reticle-temperature increases caused by exposure of the reticle to irradiation may be corrected, providing greater image-transfer accuracy.

Sixth Representative Embodiment

Whereas the alignment marks 53 on a reticle usable with the pattern-transfer apparatus of FIG. 2 are described above as located on a downstream-facing surface of the reticle 5 (i.e., on the opposing surface 52a of the support grid 52 facing the substrate 11 when the reticle is mounted as shown in FIG. 1(a)), the alignment marks on a reticle according to this embodiment are situated on an upstream-facing surface of the reticle (i.e., on the opposing surface 52a facing upstream). Such a reticle according to this embodiment can be used with an apparatus such as that shown in FIG. 2, but with the mark-detection system 25 being situated upstream of the reticle).

Situating the alignment marks 53 on the opposing surface 52a of the support grid 52 allows projected pattern-image errors resulting from any distortion of the reticle 5 to be corrected based on the positions of the alignment marks for each reticle subfield. As a result, the mask pattern can be transferred to the substrate 11 with high accuracy. Also, the accuracy by which multiple layers of subfield pattern images can be superposed on the substrate is improved relative to the prior art.

In addition, by situating the alignment marks 53 on the support grid 52 (which extends from non-patterned regions of the reticle), the surface area of the mask pattern need not be increased to accommodate the alignment marks 53.

Seventh Representative Embodiment

According to this embodiment, as shown in FIG. 5, the reticle 5 is mounted to a reticle holder 30 (or a reticle holder mounted on the reticle stage) using, e.g., a static chuck 31. The positional relationship between the alignment marks 53 on a distorted reticle 5 and alignment marks 33 (or "fiducial marks") on a reticle holder 30 can be measured prior to mounting the reticle holder in the pattern-transfer apparatus. Alternatively, the positional relationship between the alignment marks 53 on a distorted reticle 5 and alignment marks 33 on a reticle stage 30 (or a reticle holder mounted on reticle holder 30) can be measured after mounting the reticle on the reticle holder 30. Such measurement data can be input to a memory 16a (FIG. 2) so that the electron beam may be manipulated as required during exposure to correct for reticle distortion due to mounting of the reticle.

Eighth Representative Embodiment

Figure 6:
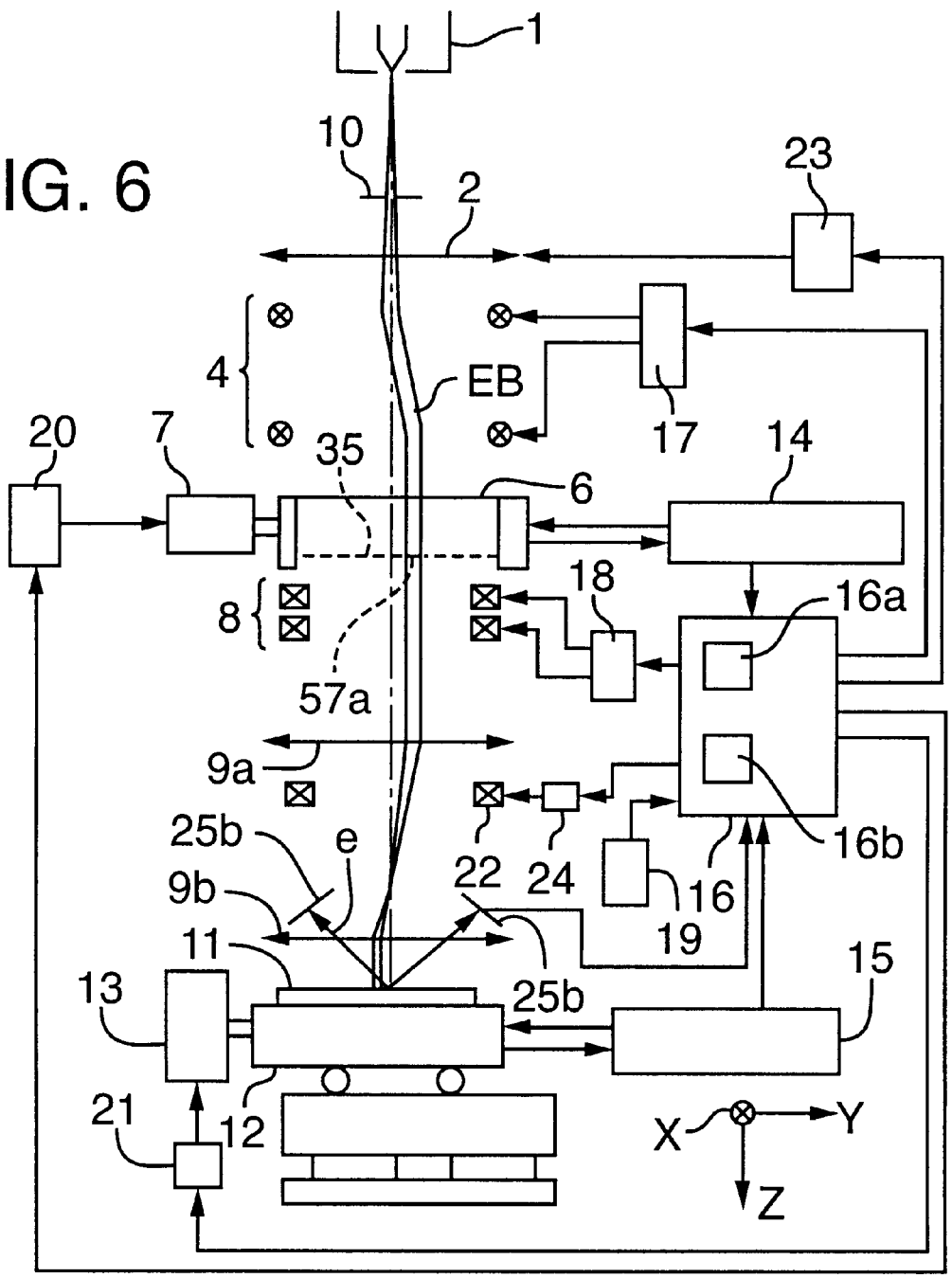
FIG. 6 is an elevational schematic diagram of an eighth representative embodiment of the invention, namely a pattern-transfer apparatus for use with an electron-beam as the charged particle beam.

A CPB pattern-transfer apparatus according to this embodiment is shown in FIG. 6. In FIG. 6, components that are the same as shown in FIG. 2 and described in connection with the second representative embodiment have the same reference numerals and are not described further. The FIG. 6 embodiment utilizes an electron beam as an exemplary charged particle beam.

The FIG. 6 embodiment utilizes a mark-detection system comprising at least one reflected-electron detector 25b that detects electrons e reflected from the substrate 11 due to electrons of the electron beam EB impinging upon the substrate surface. A corresponding electrical signal generated by the reflected-electron detector 25b is routed to the master controller 16.

More specifically, the reflected electrons e are generated when the electron beam EB, passing through stencil-type alignment marks 57a on a reticle 35 and strikes corresponding reference marks (not shown) defined on the surface of the substrate 11. The reflected electrons e are detected by the reflected-electron detector 25b. The positions of the alignment marks are calculated by the arithmetic/logic unit 16b of the master controller 16 based on such signals and on signals generated by the reticle-stage detector 14.

Figure 7A:
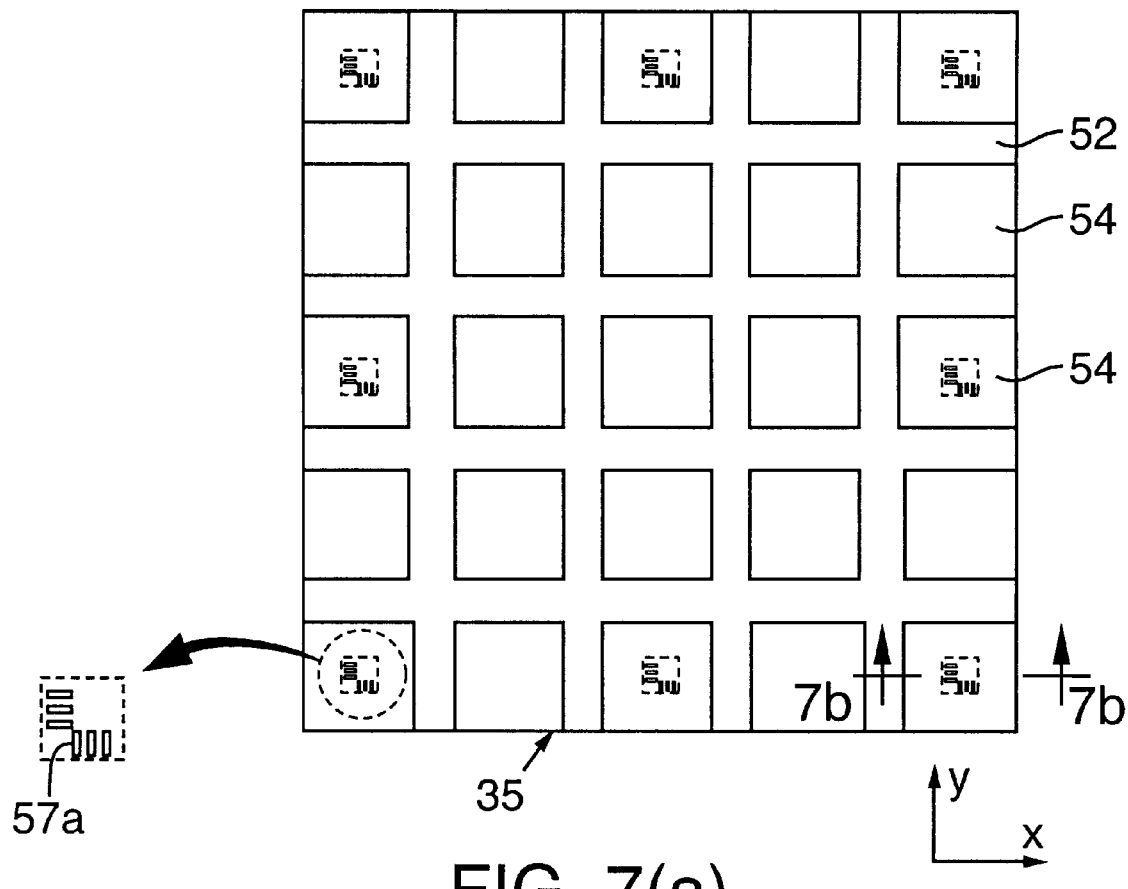
FIG. 7(a) is a schematic plan view of an exemplary reticle usable with the FIG. 6 apparatus.
Figure 7B:
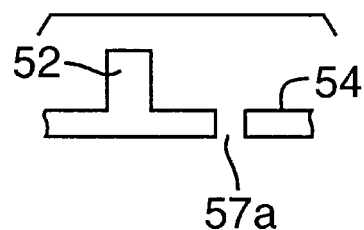
FIG. 7(b) is a schematic elevational section of the reticle of FIG. 7(a) along the line A—A.

An exemplary reticle 35 as used in the FIG. 6 apparatus is shown in FIGS. 7(a)–7(b), wherein FIG. 7(a) is an enlarged plan view of the reticle and FIG. 7(b) is an elevational section along the line A—A of FIG. 7(a). FIG. 7(a) shows multiple mask subfields 54, of which selected mask subfields include a stencil-type alignment mark 57a. For example, as shown in FIG. 7(a), the alignment marks 57a can be formed in peripheral mask subfields 54 on the reticle 35. FIG. 7(b) shows a portion (strut) of the support grid 52, the mask subfield 54, and a void denoting the location of the alignment mark 57a.

Figure 8:
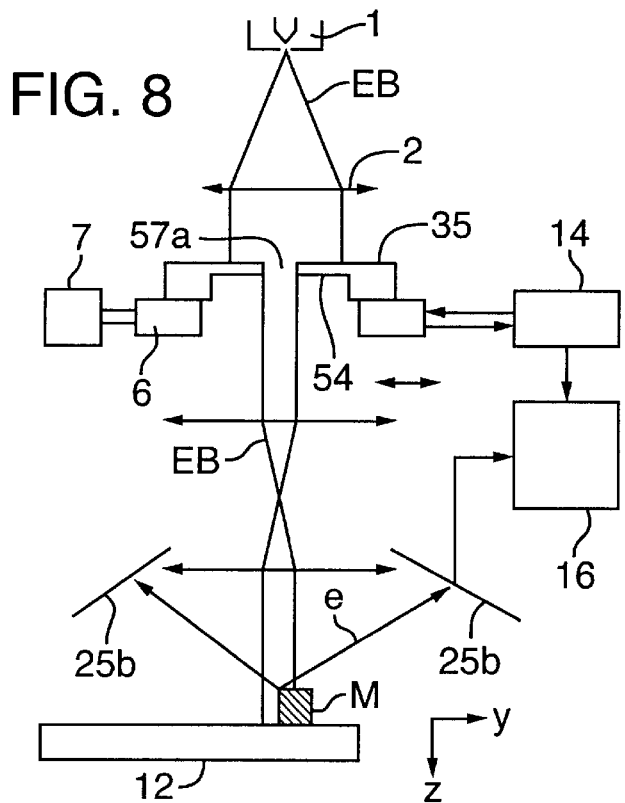
FIG. 8 is an elevational schematic diagram showing certain details of the apparatus of FIG. 6.

FIG. 8 provides more detail regarding the mark-detection system and peripheral components. The item denoted "M" indicates a reference mark on the substrate stage 12. The reference marks M are the standards against which distortion measurements of the reticle 35 are made. The electron beam EB is directed at a mask subfield 54 including a stencil-type alignment mark 57a. After passing through the alignment mark 57a, the electron beam EB scans the corresponding reference mark M in the x and y directions. Electrons e reflected from the reference mark M are detected by the reflected-electron detector 25b. Actual positions of each alignment mark 57a are determined, and deviations of such positions from the design positions are calculated from such determinations and from the corresponding positions of the reticle stage 6 (as sensed by the reticle-stage detector 14). Distortion of the reticle is determined by performing similar measurements with respect to multiple alignment marks 57a on the reticle.

In this embodiment, because actual distortion of the reticle 35 is measured by detecting reflected electrons e generated when the electron beam EB, passing through the alignment marks 57a, is reflected by the reference marks M on the substrate stage 12. Hence, distortion of the reticle 35 mounted on the reticle stage 12 can be measured with high accuracy.

Ninth Representative Embodiment

Figure 9A:
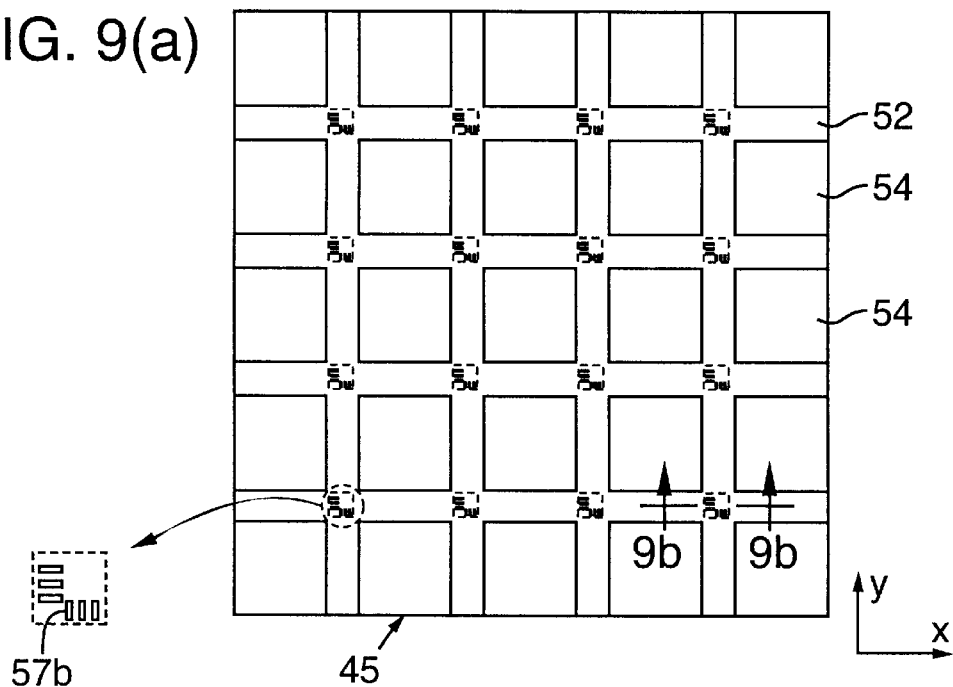
Figure 9B:
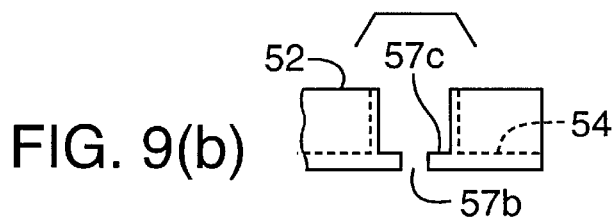

A reticle 45 according to this embodiment is shown in FIGS. 9(a)–9(b), wherein FIG. 9(a) is an enlarged plan view of the reticle 45 and FIG. 9(b) is an elevational section along the line B—B of FIG. 9(a). FIG. 9(a) shows multiple mask subfields 54 separated from one another by the support grid 52. An alignment mark 57b is situated at each location where struts of the support grid 52 intersect. As shown in FIG. 9(b), a subfield 57c is defined at each such intersection, and a stencil-type alignment mark 57b is defined in the membrane of the subfield.

Tenth Representative Embodiment

Figure 10:
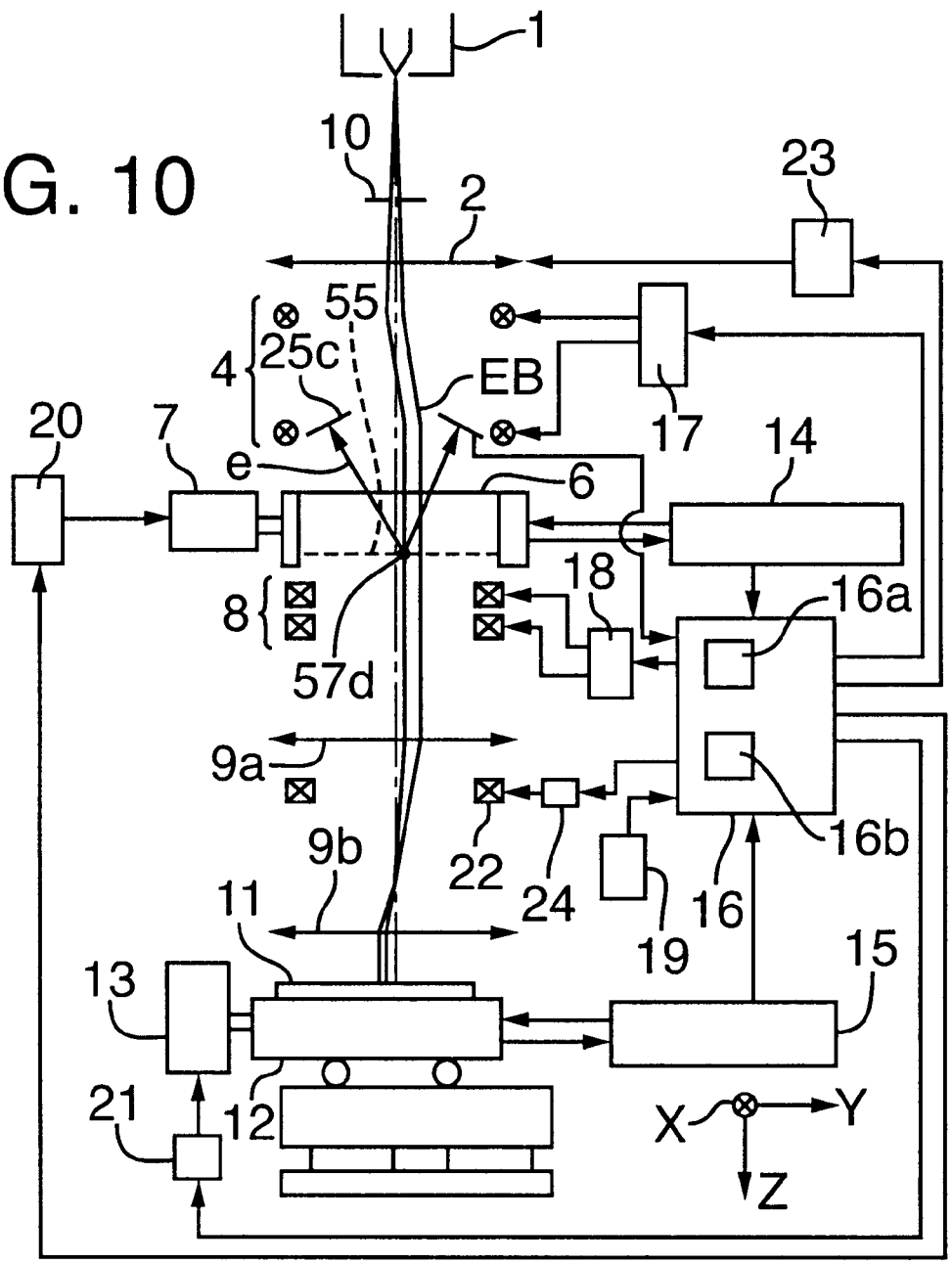
FIG. 10 is an elevational schematic diagram of a tenth representative embodiment of the invention, namely a pattern-transfer apparatus for use with an electron-beam as the charged particle beam.
Figure 11:
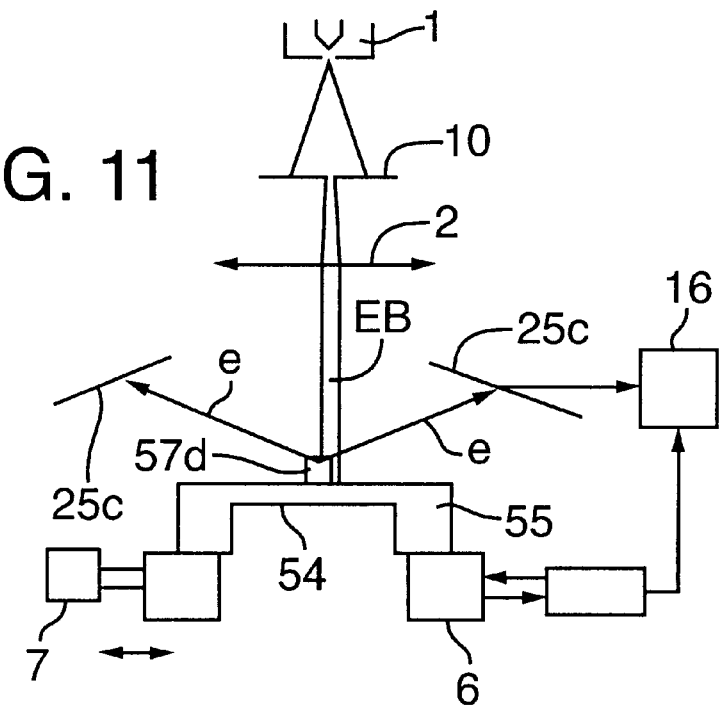
FIG. 11 is an elevational schematic diagram showing certain detains of the apparatus of FIG. 10.

A pattern-transfer apparatus according to this embodiment is depicted in FIG. 10, and FIG. 11 provides further detail regarding detection of reticle distortion. In FIG. 10, components that are the same as corresponding components in the FIG. 2 embodiment have the same reference numerals and are not described further. The reticle 55 used with the FIG. 10 embodiment typically comprises multiple alignment marks 57d. As the electron beam EB propagates from the source 1 to the reticle 55, the transverse profile of the electron beam is shaped by passage of the beam through the aperture 10a. The electron beam EB illuminates an alignment mark 57d, and electrons reflected from the alignment mark 57d are detected by a reflected-electron detector 25c. During such illumination, the electron beam EB is scanned over the alignment mark 57d in two dimensions (x and y directions) and electrons e reflected from the alignment mark 57d are detected by the reflected-electron detector 25c. The actual position of the alignment mark 57d and any deviation thereof from the "design" (ideal) position are calculated from signals generated by the reflected-electron detector 25c and from the reticle-stage detector 14. Distortion of the reticle 55 can be measured by performing a similar measurement with respect to each alignment mark 57d on the reticle 55.

The alignment marks 57d can be formed using a film of a suitable heavy metal. For example, the alignment marks can comprise groove patterns on an upstream-facing surface 52a of the support grid 52.

Eleventh Representative Embodiment

Figure 12:
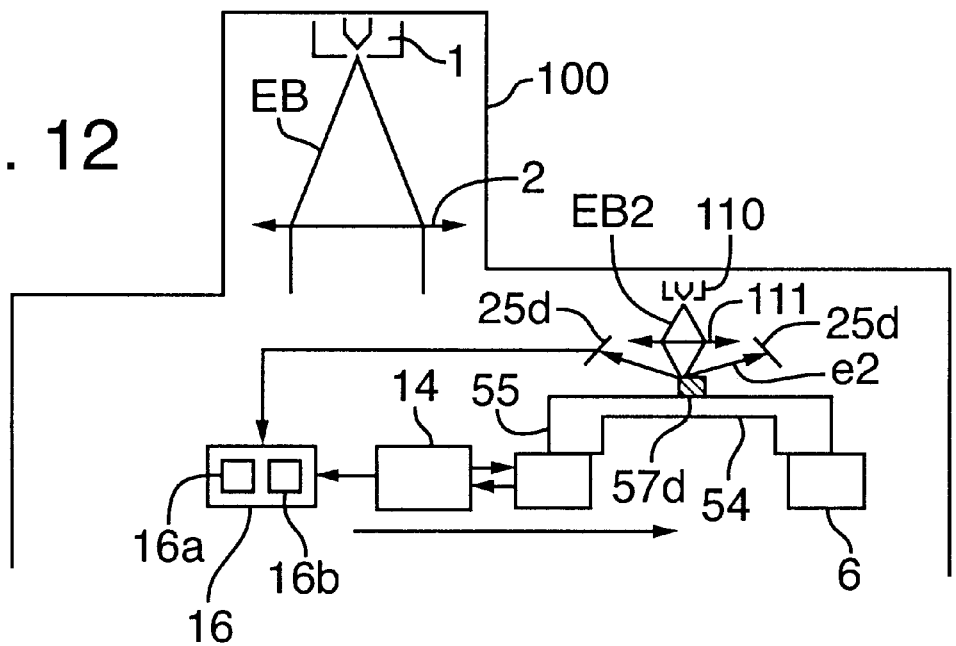
FIG. 12 is a elevational schematic diagram showing certain details of an eleventh representative embodiment of the invention, namely a pattern-transfer apparatus for use with an electron-beam as the charged particle beam, and employing a separate energy beam for detection of reticle distortion.

In a pattern-transfer apparatus according to this embodiment, reticle distortion is determined using a separate charged particle beam (or other energy beam) from the beam EB used for projection-exposure of the reticle. The apparatus is depicted schematically in FIG. 12, wherein the reticle-measurement beam EB2 is situated inside the main column 100 through which the exposure beam EB passes. Basically, reticle distortion is measured using a distortion-measuring scanning electron microscope. The reticle-measurement beam EB2 is produced by a respective electron gun 110 and converged by a condenser lens 111 onto an alignment mark 57d on the reticle 55. Each alignment mark 57d on the reticle 55 is scanned by the electron beam EB2 in two dimensions (x and y). Secondary electrons e2 generated from a locus on the reticle 55 irradiated by the electron beam EB2 are detected by secondary-electron detectors 125. The resulting signal from the secondary-electron detectors 125 is routed to a master controller 16. The master controller 16 comprises an arithmetic/logic unit 16b that calculates the distortion of the reticle 55 based on "design" (ideal) position information for the alignment marks 57d stored in the memory 16a of the master controller 16, data regarding the secondary electrons, and data regarding the respective positions of the reticle stage as obtained from the reticle-stage detector 14.

During measurement of reticle distortion, the reticle stage 6 is moved (to the right in FIG. 12) from an "exposure" position (at which exposure is performed) to a "measurement" position (at which the distortion measurement is performed). In this embodiment, reticle-distortion measurements are made using a type of scanning electron microscope separate from the electron-optical system (e.g., lens 2) used to perform exposure of the mask pattern onto the substrate.

As an alternative to measuring reticle distortion using an electron-beam system or other charged-particle-beam system (e.g., ion beam), such measurements can be performed using a beam of electromagnetic radiation such as light. Preferably, according to this embodiment, a reticle-distortion measurement system utilizing light is located inside the main column 100 for the projection-optical system, which offers prospects of more accurate distortion measurements.

Whereas the invention has been described above in connection with multiple representative embodiments, it will be understood that the invention is not limited to those embodiments. On the contrary, the invention is intended to encompass all alternatives, modifications, and equivalents as may be included within the spirit and scope of the invention as defined by the appended claims.

What is claimed is:

1. A reticle for exposing a pattern onto a sensitized substrate using a charged particle beam, the reticle comprising:
   (a) a thin film defining a mask pattern;
   (b) a support grid comprising intersecting struts, the support grid having a thin-film-facing portion and an opposing surface, the thin-film-facing portion supporting the thin film; and
   (c) an alignment mark defined by the reticle, the alignment mark being configured and situated so as to be used for measuring reticle distortion.

2. The reticle of claim 1, wherein each alignment mark is a stencil mark.

3. The reticle of claim 1, wherein the alignment mark is formed on or in the support grid.

4. The reticle of claim 1, wherein the pattern defined by the thin film is segmented into multiple mask subfields.

5. The reticle of claim 4, wherein the alignment mark is formed on or in a mask subfield.

6. The reticle of claim 4, wherein:
   the mask subfields are separated from one another by respective boundary regions defined on the thin film such that respective struts of the support grid surround a respective membrane of each respective mask subfield; and
   a respective alignment mark is situated on or in the support grid adjacent at least one corner of at least one mask subfield bounded by respective struts.

7. The reticle of claim 6, wherein each alignment mark is a stencil mark.

8. The reticle of claim 4, wherein:
   the mask subfields are separated from one another by respective boundary regions defined on the thin film such that respective struts of the support grid surround a membrane of each respective mask subfield; and
   a respective alignment mark is situated on or in the support grid adjacent at least one side of at least one mask subfield bounded by respective struts.

9. The reticle of claim 8, wherein each alignment mark is a stencil mark.

10. The reticle of claim 1, wherein:
    the struts extend in x- and y-directions across the reticle; and
    more struts extend in the x-direction than in the y-direction so as to define stripes on the reticle extending in the x-direction, each stripe defining a respective portion of the mask pattern.

11. A reticle for exposing a pattern onto a sensitized substrate using a charged particle beam, the reticle comprising:
    (a) a thin film defining a mask pattern divided into multiple mask subfields each comprising a membrane defining a respective portion of the mask pattern through which a charged particle beam may pass;
    (b) a respective boundary region situated between adjacent reticle membranes;
    (c) a support grid, having a thin-film-facing portion and an opposing surface, of intersecting struts extending along respective boundary regions so as to support the thin film with the membranes extending between respective adjacent struts; and (d) an alignment mark, situated on or in the support grid, for measuring and correcting distortion of the reticle before exposing a mask subfield to the charged particle beam.

12. The reticle of claim 11, further comprising multiple alignment marks situated at prescribed locations on or in the support grid.

13. The reticle of claim 12, wherein the alignment marks face downstream during use of the reticle for exposing the sensitized substrate to the mask pattern.

14. The reticle of claim 12, wherein:

each strut is integral with the respective boundary region; and a respective alignment mark is situated on or in the boundary region at each location where struts intersect one another.

15. The reticle of claim 12, wherein:

each strut is integral with the respective boundary region; and a respective alignment mark is situated on the thin film at each location corresponding to a midpoint of a side of a respective mask subfield.

16. A charged-particle-beam projection-microlithography apparatus, comprising:

(a) a beam source that emits a charged particle beam along an optical axis;

(b) an aperture located on the optical axis downstream of the beam source, the aperture limiting a transverse area of the charged particle beam passing through the aperture;

(c) a reticle stage situated downstream of the aperture, the reticle stage being operable to hold a segmented reticle comprising a pattern-defining thin film and a support grid, the reticle defining an alignment mark;

(d) a first deflector for selectively deflecting the charged particle beam, passing through the aperture, to a selected mask subfield on the reticle mounted to the reticle stage so as to irradiate the selected mask subfield;

(e) a first detector situated relative to the reticle so as to detect a position of the alignment mark, the first detector producing data corresponding to the position of the alignment mark indicative of a possible distortion of the reticle;

(f) a controller to which the first detector is operably connected;

(g) a projection system located downstream of the reticle for refracting the charged-particle beam passing through the reticle so as to form an image of the irradiated mask subfield on a corresponding location on a surface of a sensitized substrate; and (h) a correction-optical system situated between the reticle and the substrate and operably connected to the controller, the correction-optical system being operable to selectively alter, as commanded by the controller, a parameter of the charged particle beam so as to correct the reticle distortion based on data produced by the first detector and processed by the controller.

17. The apparatus of claim 16, further comprising a second deflector situated downstream of the reticle stage for selectively deflecting the charged particle beam transmitted through the reticle.

18. The apparatus of claim 17, wherein the controller is operably connected to the second deflector, the controller being operable to selectively and individually command the second deflector in concert with the correction-optical system to apply a deflection to the charged particle beam as required to correct the reticle distortion.

19. The apparatus of claim 17, wherein the controller comprises a memory operable to store data pertaining to initial positions of alignment marks on the reticle and to receive and store data pertaining to actual positions of the alignment marks on the reticle as detected by the first detector, the data being used by the controller to determine a change in an actual position relative to an initial position indicating a corresponding reticle distortion, and to calculate from the determined change a required change in at least one parameter of the charged particle beam as projected on the substrate to correct the reticle distortion.

20. The apparatus of claim 19, wherein the controller is operable to produce an output signal corresponding to the data on actual positions versus the data on corresponding initial positions of the alignment marks.

21. The apparatus of claim 20, wherein the controller further comprises an arithmetic/logic unit that:

recalls data from the memory so as to calculate the change in the actual positions relative to the initial positions of the alignment marks indicating an intervening reticle distortion;

calculates from the calculated change a required correction to an image of the irradiated mask subfield on the substrate to eliminate adverse effects on the image of the reticle distortion;

produces an electrical signal corresponding to the required correction; and routes the electrical signals to the correction-optical system to perform the required correction.

22. The apparatus of claim 16, wherein the correction-optical system further comprises a magnification-correction lens, a rotation-correction lens, and a stigmator.

23. The apparatus of claim 16, wherein the first detector is situated and configured to detect charged particles from the charged particle beam that propagate from the alignment mark to the first detector due to impingement of the charged particle beam on the alignment mark.

24. The apparatus of claim 23, wherein:

the charged particle beam is an electron beam; and the first detector is operable to detect electrons reflected from the alignment mark.

25. The apparatus of claim 24, further comprising a second detector operable to detect electrons reflected from the alignment mark.

26. The apparatus of claim 16, wherein the alignment mark is situated so as to receive an energy beam that interacts with the alignment mark in a way that is detectable by the first detector to produce the data corresponding to the position of the alignment mark.

27. The apparatus of claim 26, wherein the energy beam is a charged particle beam.

28. The apparatus of claim 27, wherein the energy beam is a separate charged particle beam from the charged particle beam used to illuminate the mask subfield.

29. The apparatus of claim 26, wherein the energy beam is an electron beam.

30. The apparatus of claim 26, wherein the energy beam is a beam of electromagnetic radiation.

31. A method for correcting an error in an image of a portion of a reticle and for projecting a corrected image of the reticle portion onto a sensitized surface of a substrate using a charged particle beam, the method comprising the steps:

(a) providing a reticle comprising a thin film defining a pattern segmented into multiple mask subfields, each mask subfield comprising a membrane defining a respective portion of the mask pattern through which a charged particle beam may pass, the reticle membranes being separated from one another by boundary regions, the reticle further comprising a support grid of intersecting struts coextensive with the boundary regions and alignment marks individually situated on or in either a downstream- or upstream-facing surface of the support grid at respective prescribed locations around a respective reticle membrane;

(b) before exposing a selected mask subfield to the charged particle beam to projection-expose the pattern portion defined by the respective reticle membrane onto the substrate, (i) determining an initial position of the respective reticle membrane at a first moment in time; (ii) storing data, corresponding to the determined initial position, in a memory; and (iii) determining an actual position of the respective reticle membrane by detecting, at a second moment in time after the first moment, positions of the alignment marks situated around the respective reticle membrane, thereby producing actual-position data for the reticle membrane;

(c) recalling the initial-position data and comparing the actual-position data with the recalled initial-position data to obtain data concerning a type and amount of correction required to make the actual position coincide with the initial position, the correction being to at least one of scaling, rotation, and astigmatism errors resulting from distortion of the reticle arising between the first and second moments in time;

(d) based on the data determined in step (c), altering a characteristic of the charged particle beam to correct the at least one of scaling, rotation, and astigmatism errors by the determined correction amount; and (e) exposing the selected mask subfield using the corrected charged particle beam to form an image of the respective reticle membrane on the substrate.

32. In a projection-exposure method in which a charged particle beam is used to project a reticle pattern onto a sensitive substrate, the reticle pattern being defined by a segmented mask comprising multiple mask subfields separated from one another by struts of a support grid, an improvement comprising:

(a) providing multiple distortion-measurement marks on the reticle;

(b) placing the reticle on a reticle stage that holds the reticle for projection-exposure of the mask pattern;

(c) directing an energy beam at the distortion-measurement marks on the reticle to allow the energy beam to interact with the individual distortion-measurement marks;

(d) detecting a component of the energy beam propagating from the individual distortion-measurement marks as a result of interaction of the energy beam with the respective distortion-measurement marks so as to measure an actual position of the respective distortion measurement marks;

(e) comparing the actual positions with ideal positions of the distortion-measurement marks; and (f) calculating a reticle distortion from the comparisons made in step (e).

33. The method of claim 32, wherein the energy beam is the charged particle beam used to projection-expose the mask pattern.

34. The method of claim 32, wherein the energy beam is separate from the charged particle beam used to projection-expose the mask pattern.

35. The method of claim 32, wherein step (e) comprises recalling data on the ideal positions from a memory, then comparing data on the actual positions with corresponding data on the ideal positions.

36. In a method for projection-exposing a substrate with a mask pattern using a charged-particle-beam projection-exposure apparatus, a reticle-distortion measuring method, comprising:

(a) directing the charged particle beam in sequence at multiple distortion-measurement marks on a reticle mounted on a reticle stage of the projection-exposure apparatus;

(b) detecting particles from the charged particle beam reflected from the distortion-measurement marks;

(c) from data produced in step (b), measuring the respective actual positions of the distortion-measurement marks and comparing data on the respective actual positions with corresponding data on respective ideal positions of the distortion-measurement marks; and (d) from the comparison performed in step (c), calculating a distortion of the reticle.

37. The method of claim 36, including the step of correcting the distortion before projection-exposing a corresponding region of the reticle.

38. The method of claim 36, wherein correcting the distortion comprises changing a parameter of the charged particle beam.

39. A reticle-distortion-measurement method used in a charged-particle-beam projection-exposure apparatus that projects a pattern defined by a reticle onto a sensitive substrate using a charged particle beam, the method comprising:

(a) directing a charged particle beam as used for projection-exposure of the reticle at a plurality of distortion-measurement marks situated on a reticle mounted on a reticle stage of the projection-exposure apparatus, the distortion-measurement marks being permeable to the charged particle beam such that a portion of the charged particle beam passes through the distortion-measurement marks and strikes corresponding reference marks situated on a substrate stage on which the substrate is mounted during projection-exposure;

(b) detecting particles of the charged particle beam propagating from the reference marks due to interaction of charged particles from the distortion-measurement marks with the reference marks, and, from such detections, measuring actual positions of each of the distortion-measurement marks; and (c) from data concerning the actual positions obtained in step (b), and from data concerning ideal positions of the distortion-measurement marks with which the data obtained in step (b) is compared, calculating reticle distortion.

40. The method of claim 39, further comprising the step, after step (c), of imparting a change to the charged particle beam so as to correct the reticle distortion before projection-exposing the reticle.

41. In a charged-particle-beam projection-exposure apparatus that utilizes a charged particle beam to expose a mask pattern defined by a segmented reticle onto a sensitive substrate, a reticle-distortion-measuring device comprising:

(a) position-detection means for detecting respective actual positions of distortion-measurement marks on a reticle mounted onto a reticle stage of the projection-exposure device; and (b) computing means for determining reticle distortion based on the detected actual positions of the distortion-measurement marks as obtained by the position-detection means compared to corresponding data on ideal positions of the respective distortion-measurement marks on the reticle.

42. The apparatus of claim 41, wherein the position-detecting means comprises:

an electron-beam source for producing an electron beam as the charged particle beam;

an electron-optical system that receives the electron beam from the source, condenses the electron beam, and directs the electron beam at the distortion-measurement marks; and a secondary electron detector that detects secondary electrons produced by the distortion-measurement marks as the distortion-measurement marks are irradiated by the electron beam.

43. The apparatus of claim 42, further comprising a correction-optical system for modifying a parameter of the charged particle beam to correct the reticle distortion.

44. The apparatus of claim 43, wherein the correction-optical system comprises one or more of a magnification-correction lens, a rotation-correction lens, and a stigmator.

* * * * *